United States Patent [19]

Shou et al.

[11] Patent Number: 5,631,941
[45] Date of Patent: May 20, 1997

[54] REGISTER CIRCUIT

[75] Inventors: Guoliang Shou; Sunao Takatori; Makoto Yamamoto, all of Tokyo, Japan

[73] Assignees: Yozan Inc., Tokyo; Sharp Corporation, Osaka, both of Japan

[21] Appl. No.: 558,418

[22] Filed: Nov. 16, 1995

Related U.S. Application Data

[63] Continuation of Ser. No. 261,904, Jun. 15, 1994, abandoned.

[30] Foreign Application Priority Data

| Jun. 15, 1993 | [JP] | Japan | 5-168478 |
| Jun. 22, 1993 | [JP] | Japan | 5-174712 |
| Sep. 20, 1993 | [JP] | Japan | 5-256548 |
| Dec. 28, 1993 | [JP] | Japan | 5-351854 |
| Jan. 31, 1994 | [JP] | Japan | 6-027493 |
| Apr. 1, 1994 | [JP] | Japan | 6-087384 |

[51] Int. Cl.[6] .................................................. G11C 19/00
[52] U.S. Cl. .................... 377/75; 327/200; 327/333; 327/437
[58] Field of Search ........................ 327/75, 333, 437, 327/200

[56] References Cited

U.S. PATENT DOCUMENTS

| 3,573,498 | 4/1971 | Ahrons | 327/200 |
| 3,925,685 | 12/1975 | Suzuki | 326/98 |
| 5,343,083 | 8/1994 | Fuse | 327/333 |
| 5,347,174 | 9/1994 | Götz | 327/333 |

*Primary Examiner*—Margaret Rose Wambach
*Attorney, Agent, or Firm*—Cushman, Darby & Cushman IP Group of Pillsbury Madison & Sutro LLP

[57] ABSTRACT

A quantized voltage is held by a holding circuit or a feedback circuit connected to a quantizing circuit so that a multi-valued voltage is registered. In another embodiment, outputs of bi-stable circuits with stopwise thresholds are added with weights introduced by a capacitive coupling.

12 Claims, 21 Drawing Sheets

REGISTER CIRCUIT

This is a continuation of Ser. No. 08/261,904, filed on Jun. 15, 1994, which was abandoned.

DETAILED DESCRIPTION OF THE INVENTION

1. Field of the Invention

The present invention relates to a register circuit for registering analog data.

2. Description of Related Art

Conventional computers are digital. Registers and other memory means handle only digital data. Digital computation has good accuracy and redundancy, however, due to high equipment costs in the manufacturing process analog computation was frequently used for solving differential equations. Because of the limitation of digital computers, analog computation is attractive again, but conventional analog register circuits are poor.

SUMMARY OF THE INVENTION

It is an object of the present invention to provide a register circuit suitable for analog computation.

According to the present invention, analog data is held as a status combination of thresholding which is totally integrated through capacitive coupling at the output.

In the present invention, analog signals are converted into multi-level signals using thresholding circuitry and the like. Like digital signals, the multi-level signals are gated and quantized, incremented and decremented. However, unlike digital signals, multi-level signals are not restricted to binary representations. By operating on multi-level signals that represent the analog signals, the present invention is able to provide a register circuit for data generated in circuitry performing analog computations.

PREFERRED EMBODIMENT OF THE INVENTION

Hereinafter each embodiment of the present invention is described with reference to the attached drawings.

Figure 1:
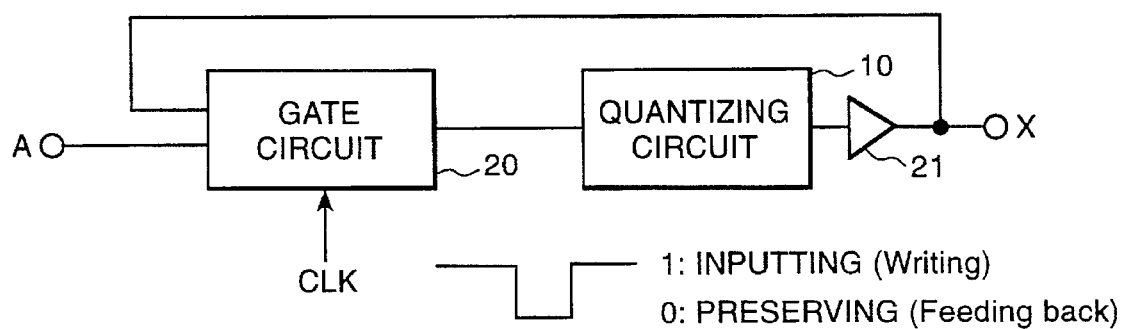
FIG. 1 is a circuit diagram of the first embodiment of a register circuit according to the present invention.

FIG. 1 shows a D-type flip-flop constructed by combining a quantizing circuit 10, gate circuit 20 and source follower 21. Gate circuit 20 is controlled by clock CLK, and it has a function of alternatively selecting an analog or multi-valued input A from either the outside or a feedback signal of quantizing circuit 10, as an input of the quantizing circuit.

When the clock is equal to 1, data is written after inputting input signal A to quantizing circuit 10. When the clock is equal to 0, written data is preserved after feeding back an output of quantizing circuit 10. According to a flip-flop in FIG. 1, it is possible to convert the input analog signal A into a multi-valued signal and then to preserve it.

Quantizing circuit 10 is a complement circuit for quantizing analog input voltage A to a multi-valued voltage of 3 bits resolution and for outputting a voltage signal corresponding to a complement of the quantized signal. A relationship between analog input voltage A and a quantized multi-valued voltage is shown in TABLE 1, where the maximum level is defined as a multi-valued number 7 corresponding to the reference voltage Vd.

TABLE 1

| INPUT | | VOLTAGE | | MULTI-VALUE |
|---|---|---|---|---|
| 0 | ≦ | A | < | Vd/8 | 0 |
| Vd/8 | ≦ | A | < | 2Vd/8 | 1 |
| 2Vd/8 | ≦ | A | < | 3Vd/8 | 2 |
| 3Vd/8 | ≦ | A | < | 4Vd/8 | 3 |
| 4Vd/8 | ≦ | A | < | 5Vd/8 | 4 |
| 5Vd/8 | ≦ | A | < | 6Vd/8 | 5 |
| 6Vd/8 | ≦ | A | < | 7Vd/8 | 6 |
| 7Vd/8 | ≦ | A | | | 7 |

Figure 2:
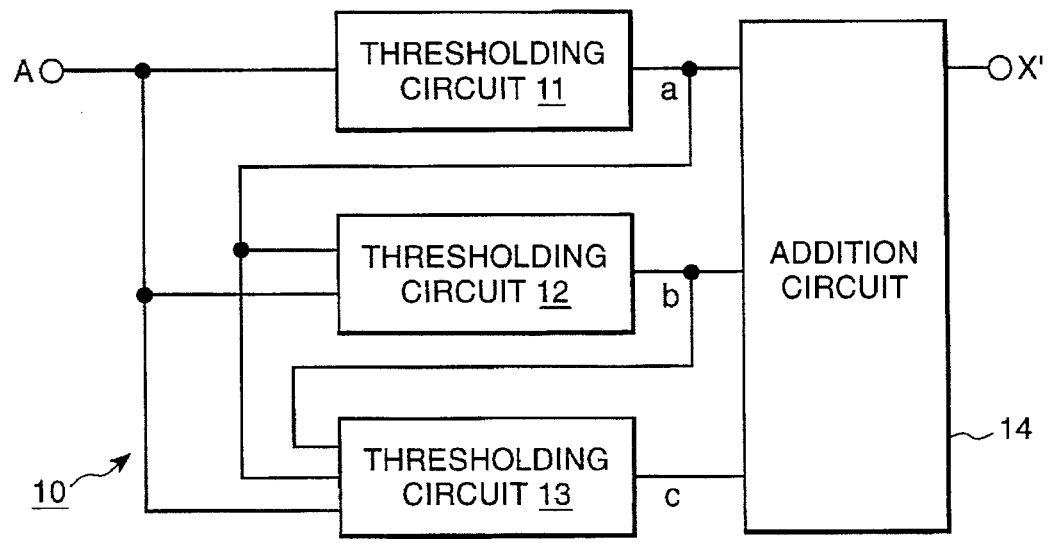
FIG. 2 is a quantizing circuit from FIG. 1.

As seen in FIG. 2, a quantizing circuit 10 comprises 3 thresholding circuits 11, 12, and 13 for inverting the output when analog input voltage A changes to multi-valued levels 4, 2 and 1, respectively. In addition, circuit 14 is provided to add outputs a, b and c of each thresholding circuit using weighting determined by predetermined weights.

The thresholding circuits 11, 12 and 13 correspond to bits 3, 2 and 1, respectively. An output of each thresholding circuit is introduced to each lower level thresholding circuit. A capacitive coupling corresponding to each thresholding circuit adds the analog input A and the output of each higher level thresholding circuit introduced to that thresholding circuit. The capacitive coupling has predetermined weights so as to invert outputs repeatedly as the analog input increases.

Thresholding circuits for other than the highest level are connected by capacitive coupling (FIG. 2) so that an output voltage of higher thresholding circuit and input voltage X are input in parallel with input voltage A. The capacitive coupling performs the addition of the analog input voltage and the output of higher thresholding circuit that are input in parallel. The thresholding circuit outputs reference voltage Vd when the total inputs are smaller than the threshold value, and 0V when the total inputs are larger than the threshold value.

Capacitances are defined so that an input from the higher thresholding circuit by n levels is weighted by $2^n$ such that the input voltage is weighted by $2^{m-j+1}$ when the highest level is m.

Figure 3A:
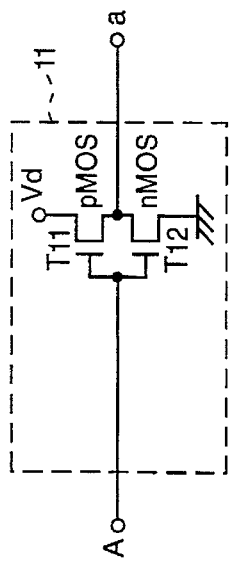
FIGS. 3(a) to 3(c) are thresholding circuits of the quantizing circuit shown in FIG. 2.
Figure 3B:
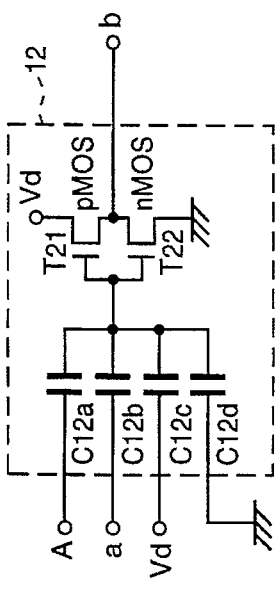
Figure 3C:
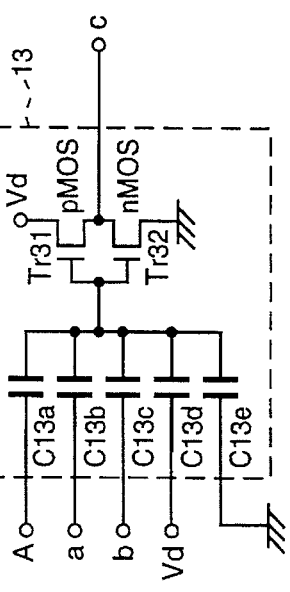

FIG. 3 (a) shows thresholding circuit 11, consisting of an inverter constructed by 2 MOS type transistors T11 and T12 to which input voltage A is inputted. The inverter has a threshold level of Vd/2, and generates an output of low level (fires) when it reaches a level that an input voltage is equal to multi-value 4.

Bias voltage Vd is connected to a drain of pMOS type transistor T11, and its source is connected to a drain of nMOS type transistor T12. The gates of both transistors are connected to each other as well as to a juncture of the capacitance, and a source of nMOS type transistor T12 is grounded.

FIG. 3 (b) shows thresholding circuit 12. The circuit includes capacitances C12a, C12b and C12c for inputting input voltage A, output "a" of thresholding circuit 11 and reference voltage Vd. An inverter is provided, composed of 2 MOS type transistors T21 and T22 connected to an output from grounded capacitance C12d and the common output of the, former three capacitances C12a, C12b, C12c. The ratio of capacitances C12a, C12b, C12c and C12d is 4:2:1:1, respectively.

FIG. 3 (c) shows thresholding circuit 13. Similar to the circuit 12, the circuit consists of capacitances C13a, C13b, C13c and C13d for inputting input voltage A, outputs "a" and "b" of threshold circuit 11 and 12 and reference voltage Vd, and of an inverter composed of 2 MOS type transistors T31 and T32 to which outputs from an earthed capacitance C13e and the former capacitances. The ratio of capacitances C13a, C13b, C13c, C13d and C13e is 8:4:2:1:1, respectively.

When an electrostatic capacity of each capacitance and an input voltage corresponding to each capacitance are defined as Ci and Vi, respectively, voltage Vout generated by the capacitive coupling in the threshold circuit is shown by the following Formula 1.

$$Vout = 93 \ (C_i \cdot V_i)/\Sigma Ci \qquad (1)$$

A threshold value of thresholding circuits 11, 12 and 13 are all equal to Vd/2, and the circuits fire (generate a low level output) when voltage Vout from the capacitive coupling exceeds Vd/2.

An output of each threshold circuit corresponding to analog input voltage A is shown below in TABLE 2. Voltages are numerically shown in the table, but the absolute value of the voltages are obtained though multiplication with the reference voltage Vd. Vout12 and Vout 13 show the result of the above formula (1) of the total voltage from the capacitive coupling before the inverter, in threshold circuits 12 and 13.

The inverter's output is inverted to 0 when Vout 12 or Vout 13 is higher than Vd and not inverted when lower than or equal to Vd.

TABLE 2

| Threshold Circuit 11 | | | | | | | | | |
|---|---|---|---|---|---|---|---|---|---|
| Input Voltage A | 0 | 1/8 | 2/8 | 3/8 | 4/8 | 5/8 | 6/8 | 7/8 | 8/8 |
| Output a | | 1 | 1 | 1 | 1 | 0 | 0 | 0 | 0 |
| Threshold Circuit 12 | | | | | | | | | |
| Input Voltage A X 4 | 0 | 0.5 | 1 | 1.5 | 2 | 2.5 | 3 | 3.5 | 4 |
| Input a X 2 | 2 | 2 | 2 | 2 | 2 | 0 | 0 | 0 | 0 |
| Vd | 1 | 1 | 1 | 1 | 1 | 1 | 1 | 1 | 1 |
| Vout12 | 3/8 | 3.5/8 | 4/8 | 4.5/8 | 5/8 | 3.5/8 | 4/8 | 4.5/8 | 5/8 |
| Output b | | 1 | 1 | 0 | 0 | 1 | 1 | 0 | 0 |
| Threshold Circuit 13 | | | | | | | | | |
| Input Voltage A X 8 | 0 | 1 | 2 | 3 | 4 | 5 | 6 | 7 | 8 |
| Input a X 4 | 4 | 4 | 4 | 4 | 4 | 0 | 0 | 0 | 0 |
| Input a X 2 | 2 | 2 | 2 | 0 | 0 | 2 | 2 | 0 | 0 |
| Vd | 1 | 1 | 1 | 1 | 1 | 1 | 1 | 1 | 1 |

TABLE 2-continued

| Vout13 | 7/16 | 8/16 | 9/16 | 8/16 | 9/16 | 8/16 | 9/16 | 8/16 | 9/16 |
|---|---|---|---|---|---|---|---|---|---|
| Output c | | 1 | 0 | 1 | 0 | 1 | 0 | 1 | 0 |

Figure 4A:
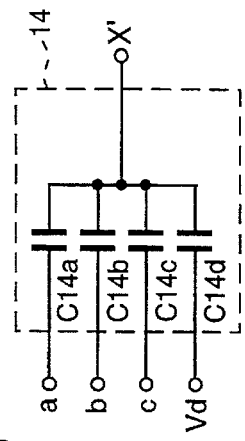
FIGS. 4(a) to 4(c) are addition circuits of the circuits in FIG. 3(a) to 3(c) respectively.
Figure 4B:
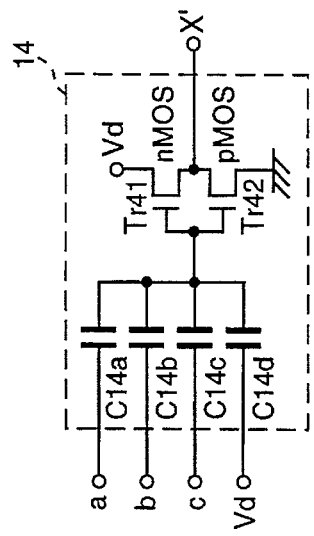

FIG. 4(a) shows an addition circuit 14 connected to a thresholding circuit. The circuit is composed of capacitances connected in parallel C14a, C14b, C14c and C14d shown in FIG. 4(a) or of a source follower consisting of 2 MOS type transistors Tr41 and Tr42 connected in parallel to a capacitance shown in FIG. 4(b). Each output a, b, and c of each thresholding circuit 11, 12 and 13 is input to capacitance C14a, C14b and C14c, respectively, and reference voltage Vd is input to capacitance C14d.

Capacitances C14a, C14b, C14c and C14d are to be a ratio of 4:2:1:1, respectively, in order to give weights of $2^n$ corresponding to the outputs of thresholding circuits 11, 12 and 13. Here the weights for n are 4, 2, 1 and 1.

Giving a weight to the output of each thresholding circuit, TABLE 3 shows a relationship between input voltage A and output voltage X' of addition circuit 14 shown in FIG. 4(a). Output voltage X' is the octal complement corresponding to input voltage A.

By arranging an output as shown in TABLE 4 above, there is a small possibility of having a wrong output X. Such an arrangement can be realized by using addition circuit 14 of FIG. (c). A circuit in FIG. 4 (c) comprises a circuit of FIG. 4(a) and grounded capacitance C14e. The ratio of capacitances C14a, C14b, C14c, C14d and C14e is 8:4:2:1:1, respectively.

Furthermore, according to the first embodiment mentioned above, a common threshold level of all inverters is Vd/2. Distribution of capacitances above is determined so that voltages between 0 and Vd are equally divided. However, when the threshold steps are not all equal or the voltage is divided in another step, the distribution of capacitance is also different.

Figure 5:
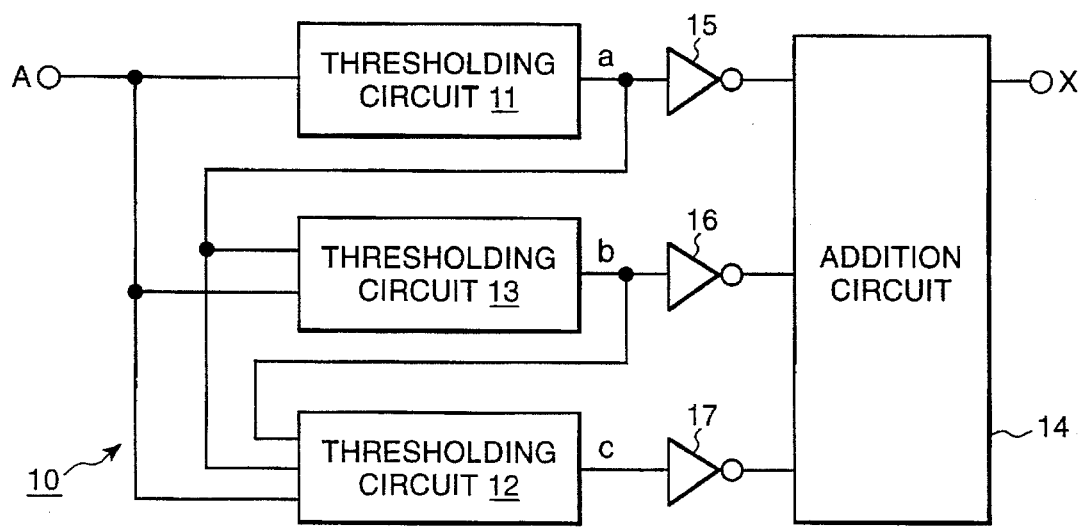
FIG. 5 shows another quantizing circuit for the register circuit in FIG. 1.

FIG. 5 shows the other quantizing circuit 10. A circuit in the second embodiment adds the outputs by capacitive coupling of addition circuit 14. After inverting outputs of each of the thresholding circuit in the circuit of the first

TABLE 3

| Input Voltage A | 0 | 1/8 | 2/8 | 3/8 | 4/8 | 5/8 | 6/8 | 7/8 | 8/8 |
|---|---|---|---|---|---|---|---|---|---|
| a x 4 | | 4 | 4 | 4 | 4 | 0 | 0 | 0 | 0 |
| Input b x 2 | | 2 | 2 | 0 | 0 | 2 | 2 | 0 | 0 |
| c | | 1 | 0 | 1 | 0 | 1 | 0 | 1 | 0 |
| Vd | | 1 | 1 | 1 | 1 | 1 | 1 | 1 | 1 |
| Output X' | | 8/8 | 7/8 | 6/8 | 5/8 | 4/8 | 3/8 | 2/8 | 1/8 |

Figure 4C:
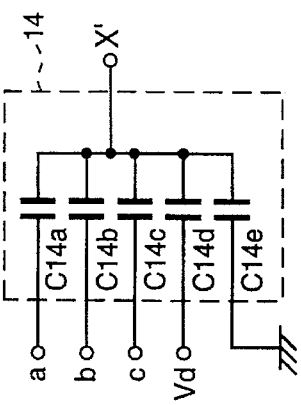

Addition circuit 14 in FIG. 4 (a) outputs the voltage from the capacitive coupling as it is. Formula 1 for converting the above capacitive coupling is valid when impedance of output side is almost infinitesimal. It is better to apply a source follower when the output impedance may be very small as shown in FIG. 4 (b).

In the addition circuits of FIG. 4 (a) and 4 (b), the threshold voltage of each quantization step is outputted as an output voltage. However, it is better to output intermediate voltage in each step in order to use the output in the following, as shown in TABLE 4.

For example, when the output voltage is 5 Vd/8, a circuit receiving the output can judge it as multi-value 5 according to the classification of TABLE 1, however, a logical error may occur by confusing the output due to voltage deviation caused by noises.

embodiment, it outputs a signal voltage of 3 bit quantization corresponding to an analog input voltage. Compositions of each thresholding circuits 11, 12 and 13 and the ratio of the capacitances of addition circuit 14 are the same as in the above circuit.

Inverters 15, 16 and 17 are provided for inverting from the thresholding circuits 11, 12 and 13, respectively. Each inverter circuit outputs the a high voltage Vd when the threshold circuit outputs a low voltage (OV), and outputs a low voltage (OV) when the threshold circuit outputs a high voltage. A relationship between input voltage A and the output of addition circuit 14 is shown in TABLE 5.

TABLE 4

| Input Voltage A | 0 | 1/8 | 2/8 | 3/8 | 4/8 | 5/8 | 6/8 | 7/8 | 8/8 |
|---|---|---|---|---|---|---|---|---|---|
| Output X' | | 15/16 | 13/16 | 11/16 | 9/16 | 7/16 | 5/16 | 3/16 | 1/16 |

TABLE 5

| Input Voltage A | 0 | 1/8 | 2/8 | 3/8 | 4/8 | 5/8 | 6/8 | 7/8 | 1 |
|---|---|---|---|---|---|---|---|---|---|
| Output of Inverter 15 | | 0 | 0 | 0 | 0 | 4 | 4 | 4 | 4 |
| Output of Inverter 16 | | 0 | 0 | 2 | 2 | 0 | 0 | 2 | 2 |

TABLE 5-continued

| Output of Inverter 17 | 0 | 1 | 0 | 1 | 0 | 1 | 0 | 1 |
|---|---|---|---|---|---|---|---|---|
| Reference Voltage Vd | 1 | 1 | 1 | 1 | 1 | 1 | 1 | 1 |
| Output X of Addition Circuit | 1/16 | 3/16 | 5/16 | 7/16 | 9/16 | 11/16 | 13/16 | 15/16 |

In the second embodiment mentioned above, a quantization with more resolution can be easily realized by increasing the number of thresholding circuits in a similar manner. It is acceptable to omit addition circuit 14 of the output and thus parallel outputs a, b, and c of three thresholding circuits 11, 12 and 13 can be output as a digital signal of 3 bits.

Source follower 21 is necessary when the circuit of FIG. 4 (a) is used as an addition circuit 14 in quantizing circuit 10, but it is unnecessary in the circuit of FIG. 4 (b).

Figure 6:
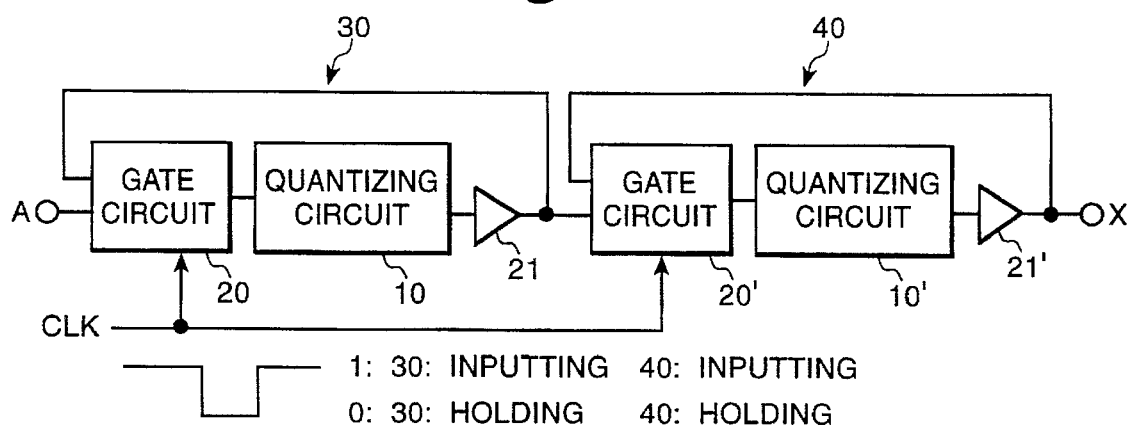
FIG. 6 is the second embodiment of the present invention.

FIG. 6 shows a master slave type flip-flop using a quantizing circuit shown in FIG. 5. Flip-flop 30 in the master side consists of a first quantizing circuit 10, a first gate circuit 20 and source-follower 21. Slave flip-flop 40 consists of a second quantizing circuit 10', a second gate circuit 20' and source-follower 21'. The composition of flip-flops 30 and 40 are the same as the gate circuit D-type flip-flop (20) shown in FIG. 1.

In FIG. 6, the first gate circuit 20 is controlled by clock CLK to select an input for the first quantizing circuit 10 from among a feedback signal of the first quantizing circuit 10 and input signal A. The second gate circuit 20' is controlled by clock CLK. The second gate circuit 20' selects an output of master side flip-flop as input to the second quantizing circuit 10' when first gate circuit 20 selects the feedback signal for input to quantizing circuit 10. The first gate circuit 20 selects a feedback signal as input to the second quantizing circuit 10', when the first gate circuit 20 selects input signal X, the feedback signal being based on the output of search quantizing circuit 10'.

In the flip-flops of FIG. 6, master side flip-flop 30 preserves the quantized input signal A at the leading edge of clock CLK (1→0) and slave side flip-flop 40 outputs the data as the output signal A.

Master side flip-flop 30 receives input signal X as the timing of the leading edge of clock CLK (0→1). Slave side flip-flop 40 shapes a feed back loop and keeps outputting data without any influences from input signal A.

Also, this embodiment needs source followers 21 and 21' in case there is a need to use the circuit of FIG. 4 (a) as an addition circuit 14 inside of quantizing circuits 10 and 10', but it does not need them in order to use the circuit of FIG. 4 (b).

According to the embodiments mentioned above, analog data can be preserved as data of n-bits, and a substantial analog register circuit can be realized. Furthermore, the size of the circuit is small and has low power consumption.

Next, a register circuit of a counter is described.

Figure 7:
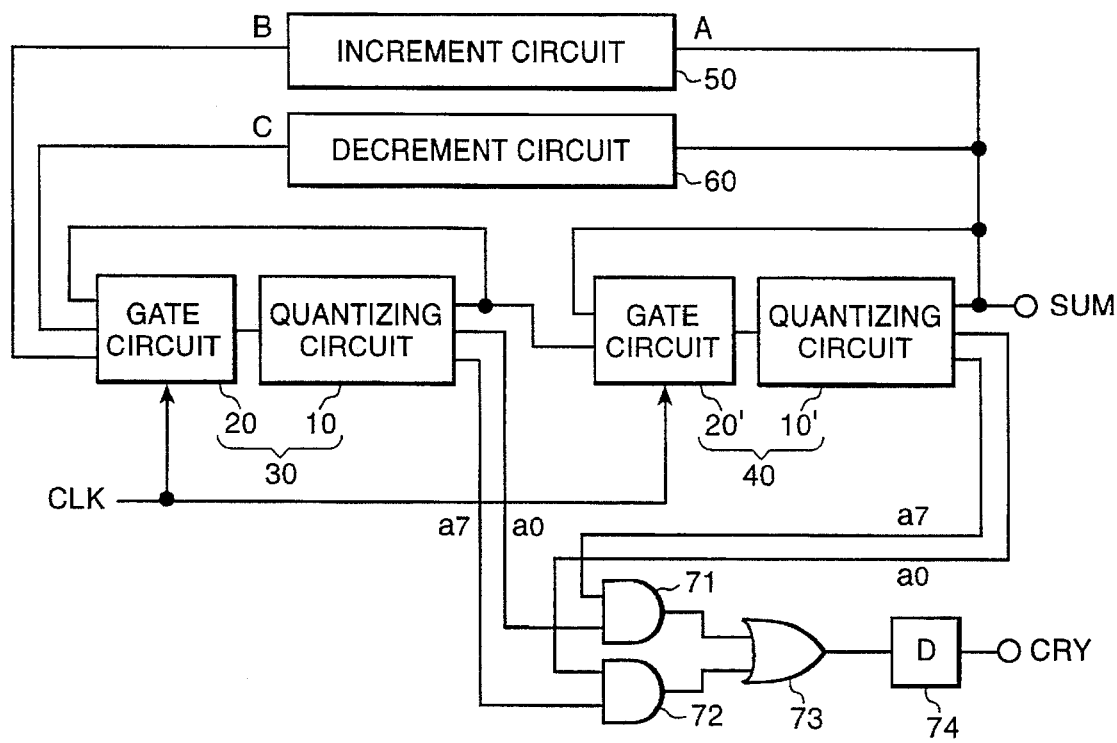
FIG. 7 is the third embodiment of the present invention.

In FIG. 7 there is a register circuit consisting of a master side flip-flop 30 with a first quantizing circuit 10, a first gate circuit 20, a second quantizing circuit 10; a second gate circuit 20'. A slave side flip-flop 40 receiving the output of master side flip-flop, increment circuit 50 and decrement circuit 60 for increment and decrement outputs of flip-flop 40, respectively.

The first and the second quantizing circuits 10 and 10' are able to quantize each analog input data into multi-valued data bits of 8 levels from 0 to 7.

The first gate circuit 20 is controlled by a clock with the 3 values of −1, 0 and 1, respectively. An input of the first quantizing circuit 10 becomes the feedback of the first quantizing circuit 10 when a clock with logical value 0 is input. The first quantizing circuit 10 receives the output β from the increment circuit or the output C from the decrement circuit 60, in response to clock of "1" or "−1", respectively.

The second gate 20 is controlled by the same clock mentioned above. When the first gate circuit 20 selects a feedback manner, that is, when a clock with logical value 0 is input, the master side output of flip-flop 30 is input to the second quantizing circuit 10. When the first gate 20 selects an output of increment circuit 50 or decrement circuit 160, that is, a clock with logical values −1 and 1 is input, an output of the second quantizing circuit 110' is fed back to the second quantizing circuit 10'.

Increment circuit 50 outputs multi-valued input data after increasing by one, and outputs zero when full count value 7 is input. Decrement circuit 160 outputs multi-valued input data after decreasing by one and outputs full count value 7 when zero count value 0 is input.

A quantizing output of the second quantizing circuit 10', that is, an output of slave side flip-flop 40, is output as a count value Sum to the outside.

The first and the second quantizing circuits 110 and 10' output a quantizing signal and 2 other signals: a0 and a7. Each a0 and a7 becomes 1 only when the output of each quantizing circuit is equal to multi-value 0 and it becomes 0 with other values. Signal a0 of the first quantizing circuit 10 and signal a7 of the second quantizing circuit 10' are input to the first AND circuit 71, and signal of the first quantizing circuit and signal a0 of the second quantizing circuit are input to the second circuit 72. The outputs of these AND circuits are united by OR circuit 73 and output as carry (taking a figure up) signal Cry through D flip-flop 74.

In the case that one of the outputs of the first and the second quantizing circuits is equal to zero count value 0 and the other output is equal to full count value 7, an output of OR circuit 173 becomes 1. The output of these quantizing circuits is one of −1, 0 and 1. When one output is equal to multi-value 7 and the other output is equal to 0, an output of one side changes from 0 to 7 (0→7) or 7 to 0 (7→0) in taking a figure up. Therefore, by examining the output of OR circuit 73, it is possible to detect the generation of a carry.

Hereinafter, FIG. 7 describes increments and decrements from the initial condition where the counter value of count type flip-flop is cleared to 0. In the initial condition, increment circuit 50 outputs multi-value 1, and decrement circuit 60 outputs multi-value 70.

When incrementing the first gate circuit 20 at the leading edge of clock (0 to 1) selects output β of increment circuit 50 and inputs it to the first quantizing circuit 10. The first quantizing circuit 110 outputs multi-value 1. At the same time, the second gate circuit 20' selects a feedback manner, and the second quantizing circuit 10' keeps outputting 0 as it is.

At the trailing edge of the clock, the first gate circuit 20 selects feedback manners. The first quantizing circuit 10 keeps outputting multi-value 1. The second gate circuit 20' inputs an output of the first quantizing circuit 10 to the second quantizing circuit 10'. The second quantizing circuit 10' outputs multi-value 1. Count value Sum, as an output of the whole circuit is multi-value 1.

The above steps are repeated synchronously with the clock, and count value Sum is decreased by one. When output of the first and the second quantizing circuits 10 and 10' become full count value 7, the increment circuit 150 outputs zero count value 0. At the leading edge of the next clock, the output of the first quantizing circuit 10 becomes 0, output of the second quantizing circuit 10' becomes 7 and output of AND circuit 72 becomes 1. Then the state of D flip-flop 74 is inverted, and a carry is generated.

In decrement mode at the trailing edge of the clock from 0 to −1 and in an initial condition whose outputs of both quantizing circuits are equal to 0, the first gate 20 selects an output of decrement circuit 60 and inputs it to the first quantizing circuit 10. Initially, decrement circuit 60 outputs multi-value 7, so that an output of the first quantizing circuit 10 becomes multi-value 7 at the trailing edge of the clock. At this time, the second gate circuit 20' selects a feedback manner, and the second quantizing circuit 10' keeps outputting 0.

At the time the output of the first quantizing circuit 10 becomes multi-value 7 and an output of the second quantizing circuit 10' becomes 0, an output of AND circuit 71 becomes 1 and the state of D flip-flop 74 is inverted and outputs a carry.

At the leading edge of the clock from −1 to 0, the first gate circuit 20 selects a feedback manner, and the first quantizing circuit 10 keeps outputting multi-value 7. The second gate circuit 20' inputs an output of the first quantizing circuit 10 to the second quantizing circuit 10' and the second quantizing circuit 110 outputs multi-value 7. Count value Sum as an output of the whole circuit becomes multi-value 7.

The above steps are repeated synchronously with the change of the clock from 0 to −1, and count value Sum is decreased by one.

In the case above, clocks of "1" and "−1" are inputted so that increments and decrements are repeatedly performed. The mentioned increments and decrements are performed synchronously with the clock. In the case that the clock is −1 is input in the condition of count value Sum is equal to 0, and when clock 1 is input in the condition of count value Sum is equal to 7, a carry signal cry is inverted.

Next, a quantizing circuit, an increment circuit, and a decrement circuit constructing a counter type flip-flop shown in FIG. 7 are explained.

Figure 8:
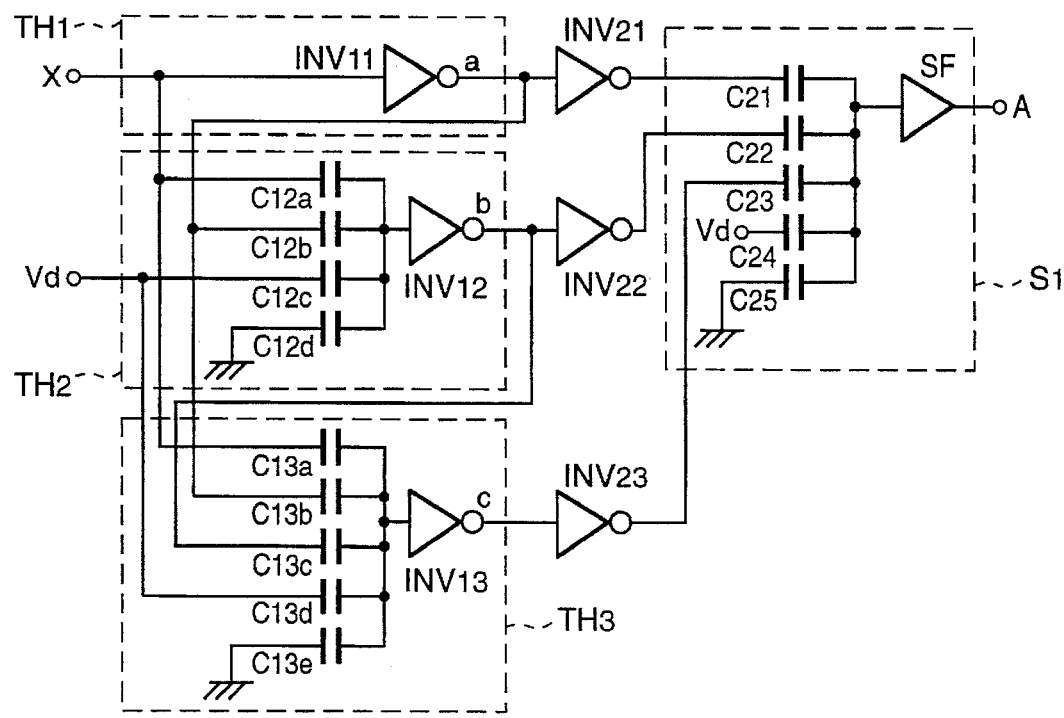
FIG. 8 shows a quantizing circuit of the circuit in FIG. 7.
Figure 9:
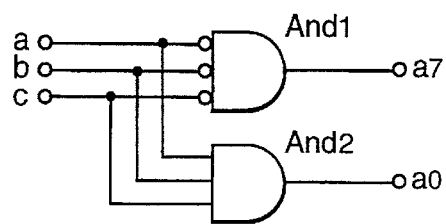
FIG. 9 is an output circuit for outputting a0 to a7 of the circuit in FIG. 8.

FIG. 8 shows an example of a quantizing circuit. Quantizing circuit 10 and 10' are circuits for quantizing analog input voltage A into multi-valued voltage with 3 bits. Hereinafter, the first quantizing circuit 10 is explained and the second quantizing circuit 10' has the same structure.

A relationship between analog input voltage X and quantized multi-valued data is shown in TABLE 6. The maximum level, multi-value 7, is shown as reference voltage Vd.

TABLE 6

| INPUT | | VOLTAGE | | MULTI-VALUE |
|---|---|---|---|---|
| 0 | ≦ | X | < | Vd/8 0 |
| Vd/8 | ≦ | X | < | 2Vd/8 1 |
| 2Vd/8 | ≦ | X | < | 3Vd/8 2 |
| 3Vd/8 | ≦ | X | < | 4Vd/8 3 |
| 4Vd/8 | ≦ | X | < | 5Vd/8 4 |
| 5Vd/8 | ≦ | X | < | 6Vd/8 5 |

TABLE 6-continued

| INPUT | | VOLTAGE | | MULTI-VALUE |
|---|---|---|---|---|
| 6Vd/8 | ≦ | X | < | 7Vd/8 6 |
| 7Vd/8 | ≦ | X | | 7 |

Quantizing circuit 10 consists of 3 thresholding circuits TH1, TH2, TH3, the outputs of which are inverted when an analog input voltage X becomes multi-values 4, 2 and 1, respectively. There are provided inverters INV21, INV22 and INV23 for inverting output of each thresholding circuit and adding circuit S1 for adding outputs from these inverters with weighting by predetermined weights.

Each thresholding circuit TH1, TH2 and TH3 corresponds to each bit of 3, 2 and 1, and each circuit receives all outputs of the higher bit together with analog input data. In this connection, the predetermined weights are used for repeatedly inverting the state of the circuit.

Each thresholding circuit, except the highest thresholding circuit, receives all of the outputs of the higher level and an input voltage X through a capacitive coupling. The analog input voltage and the outputs of the thresholding circuit to the higher stages are added by the capacitive coupling. The capacitive coupling outputs a reference voltage Vd when the total of the inputs is less than the threshold value, and it outputs 0 V when the total of the inputs exceed the threshold value.

Thresholding circuit TH1 has an inverter INV11. The threshold value of the inverter is VD/2, and it fires when the input is equal to multi-value 4.

Thresholding circuit TH2 consists of capacitances C12$a$, C12$b$, and C12$c$ where input voltage X, output "a" of threshold circuit TH1, and reference voltage Vd earthed capacitance C12$d$ and inverted INV12, which has the common output of these capacitances as input. The ratio of capacitances C12$a$, C12$b$, C12$c$ and C12$d$ is 4:2:1:1.

Similar to the above, thresholding circuit TH3 consists of capacitances C13$a$, C13$b$, C13$c$ and C13$d$ for inputting input voltage X, outputs a and b of thresholding circuits TH1 and TH2, and reference voltage Vd, and earthed capacitance C13$e$ and inverter INV13, which has common output of these capacitances as an input. The ratio of capacitances C13($a$), C13$b$, C13($c$), C13$d$ and C13$e$ is 8:4:2:1:1.

Defining the static capacity of capacitance and an input voltage for each capacitance as $Ci$ and $Vi$, respectively, voltage Vout performed capacitive coupling in the thresholding circuit is shown by the following formula.

$$Vout = \Sigma(Ci \cdot Vi)/(\Sigma Ci)$$

Threshold values of inverters INV11 to INV13 are equal to Vd/2. Thresholding circuits TH2 and TH3 fire when the voltage Vout exceeds Vd/2, then the output is inverted.

The output of each thresholding circuit corresponding to analog input voltage X is shown in TABLE 7. The voltage is numerically shown in the table, but the absolute value of the voltage is obtained by multiplying the numbers by the reference voltage Vd. Vout 12 and Vout 13 show the calculated voltage after the capacitive coupling and before each thresholding circuits TH2 and TH3, by using Formula 2.

The inverter outputs Vd (non-inverted) when Vout 12 and Vout 13 are less than Vd/2, and outputs 0 (inverted) when they are equal to more than Vd/2.

TABLE 7

| Thresholding circuit TH1 | | | | | | | | | |
|---|---|---|---|---|---|---|---|---|---|
| Input Voltage X | 0 | 1/8 | 2/8 | 3/8 | 4/8 | 5/8 | 6/8 | 7/8 | 8/8 |
| Output a | | 1 | 1 | 1 | 1 | 0 | 0 | 0 | 0 |
| Thresholding Circuit TH2 | | | | | | | | | |
| Input Voltage Xx4 | 0 | 0.5 | 1 | 1.5 | 2 | 2.5 | 3 | 3.5 | 4 |
| Input aX2 | 2 | 2 | 2 | 2 | 2 | 2 | 2 | 2 | 2 |
| Vd | 1 | 1 | 1 | 1 | 1 | 1 | 1 | 1 | 1 |
| Vout12 | 3/8 | 3.5/8 | 4/8 | 4.5/8 | 5/8 | 3.5/8 | 4/8 | 4.5/8 | 5/8 |
| Output b | | 1 | 1 | 0 | 0 | 1 | 1 | 0 | 0 |
| Thresholding Circuit TH3 | | | | | | | | | |
| Input Voltage A X 4 | 0 | 1 | 2 | 3 | 4 | 5 | 6 | 7 | 8 |
| Input a X 4 | 4 | 4 | 4 | 4 | 4 | 4 | 4 | 4 | 4 |
| Input a X 2 | 2 | 2 | 2 | 0 | 0 | 2 | 2 | 0 | 0 |
| Vd | 1 | 1 | 1 | 1 | 1 | 1 | 1 | 1 | 1 |
| Vout13 | 7/16 | 8/16 | 9/16 | 8/16 | 9/16 | 8/16 | 9/16 | 8/16 | 9/16 |
| Output c | | 1 | 0 | 1 | 0 | 1 | 0 | 1 | 0 |

Adding circuit S1, connected to a thresholding circuit, is composed of parallelly connected capacitances C21, C22, C23, C24 and C25 and a source follower SF. Outputs a, b and c of thresholding circuit TH1, TH2 and TH3 are inputted to capacitances C21, C22 and C23, respectively. Reference voltage Vd is inputted to capacitance C24, and capacitance C25 is grounded.

Capacities of capacitances C21, C22, C23, C24 and C25 give weight ratio of 4:2:1 to an output of thresholding circuits TH1, TH2 and TH3. Also, source follower SF stabilizes the output of adding circuit S1 in making the impedance of the output side infinite.

The relationship of input voltage X and output A of adding circuit S1 is shown in TABLE 8 by giving the weights to each thresholding circuit. Output voltage A becomes a quantizing signal corresponding to input voltage X.

serving the high quality linear input/output characteristics. Furthermore, the capacitance CL of low-pass filter characteristics and equilibrium resistances R1 and R2 preserve the phase margin and gain margin, and have the function of preventing resonance.

Generally, an inverter which is formed in LSI is minute, so the delay of the output is small and its oscillation is of low frequency. Low-pass capacitance CL reduces the gain of the circuit in the high frequency range and prevents resonance.

The first resistance R1 preserves the balance of current in the 2 MOS transistors composing inverter INV2. The load the MOS transistor is lowered by this function. The second resistance R2 decreases the open gain of inverter INV2 and the gain of the circuit in the whole frequency range.

Logically, both low-pass capacitances CL and equilibrium resistances R1 and R2 can independently prevent resonance.

TABLE 8

| Input Voltage X | 0 | 1/8 | 2/8 | 3/8 | 4/8 | 5/8 | 6/8 | 7/8 | 1 |
|---|---|---|---|---|---|---|---|---|---|
| Output of INV21x8 | | 0 | 0 | 0 | 0 | 8 | 8 | 8 | 8 |
| Output of INV22x8 | | 0 | 0 | 4 | 4 | 0 | 0 | 4 | 4 |
| Output of INV23x8 | | 0 | 2 | 0 | 2 | 0 | 2 | 0 | 2 |
| Reference Voltage Vd | 1 | 1 | 1 | 1 | 1 | 1 | 1 | 1 | 1 |
| Output A of Adding Circuit | 1/16 | 3/16 | 5/16 | 7/16 | 9/16 | 11/16 | 13/16 | 15/16 |
| (Multi-value | 0 | 1 | 2 | 3 | 4 | 5 | 6 | 7) |

Figure 10:
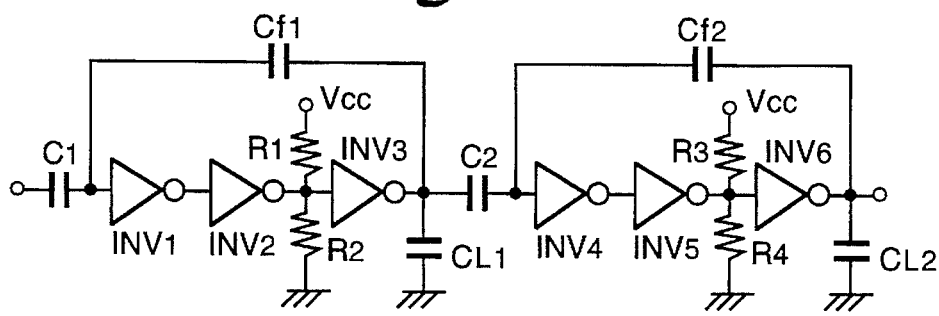
FIG. 10 is an inverter circuit from FIG. 8.

A number of inverters are serially connected as shown in FIG. 10. The inverter circuit in FIG. 10 consists of 3 stages serially connected to inverters INV1, INV2 and INV3. Input capacitance C1 is connected to the input side of inverter INV1 of the first stage. Feedback capacitance Cf for feeding outputs of the final stage inverter INV3 back to an input of the inverter INV1, and capacitance CL with low pass filter is connected at one terminal to an output of the final stage inverter INV3 and at the other terminal to the earth.

An output of the intermediate inverter is positioned between the first stage and the final stage of the inverter. The first resistance R1, connected to a power source voltage Vcc, and a grounded second resistance R2, are connected together. These resistances serve as equilibrium resistances.

Input capacitance C1 has the function of controlling the generation of electric current and keeping it above a minimum which input voltage to the first stage inverter INV1 is impressed. Feedback capacitance Cf has a function of pre- In FIG. 10, both are provided because the capacitance has excessive capacity without resistances and resistances are poor in lineality without capacitances.

Figure 11A:
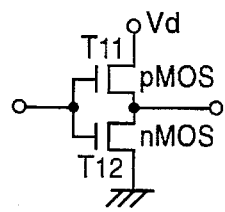
FIGS. 11(a)–11(c) show the inverter of FIG. 4 and source follower of the addition circuit in FIG. 2, respectively.

Inverters INV1, INV2 and INV3 compose the inverter circuit in FIG. 10. The C-MOS inverter composed by 2 MOS type transistors T11 and T12 are connected in parallel connected as shown in FIG. 11(a). The drain of PMOS type transistor T11 is impressed with bias voltage Vd, and its source is connected to the drain of NMOS transistor T12. The gates of both transistors are connected to each other at the capacitance, and the source of the NMOS transistor T12 is grounded.

Figure 11B:
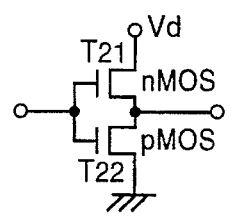

A source follower SF, used in addition circuit S1, is composed by 2 MOS type transistors parallelly connected in opposite order to C-MOS inverter QS shown in FIG. 11(b).

Figure 11C:
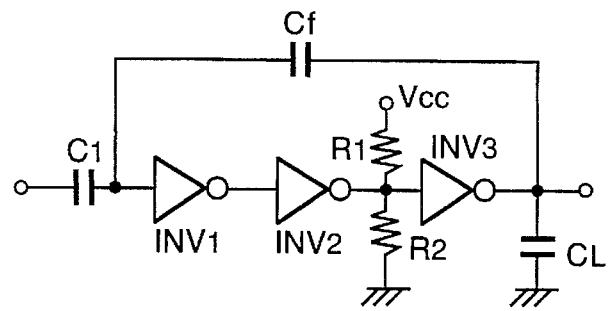

Furthermore, the circuit shown in FIG. 11(c) can be used as source follower SF. The circuit is the same as the first stage of the amplifier in FIG. 10. The circuit consists of inverters INV1, INV2 and INV3, input capacitance C1, feedback capacitance Cf, low-pass characteristics capacitance CL and feedback resistance R1 and R2.

Figure 12:
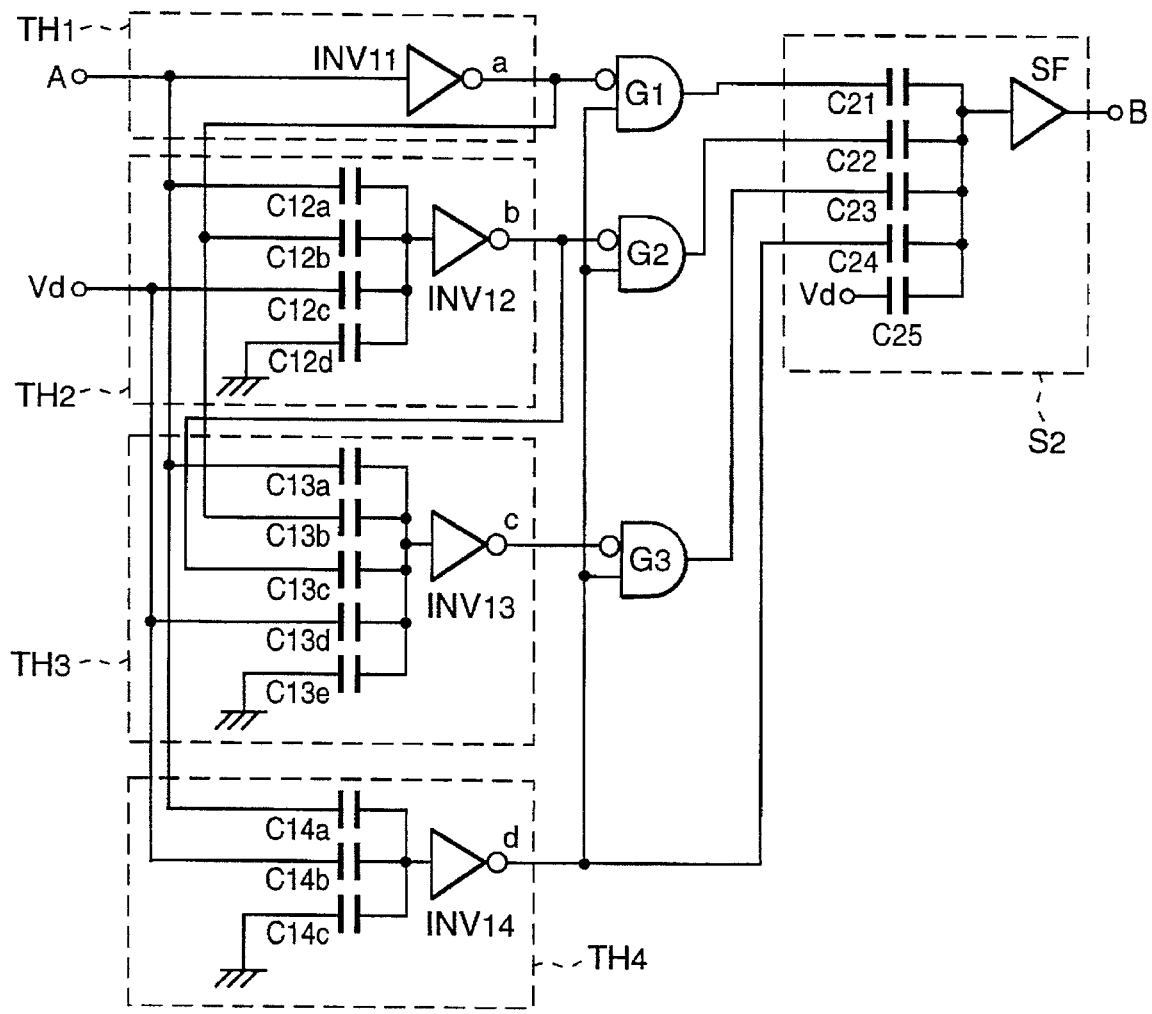
FIG. 12 is an increment circuit from FIG. 7.

FIG. 12 is a circuit diagram showing an embodiment of an increment circuit. The increment circuit in the embodiment consists of a thresholding circuit of a quantizing circuit of FIG. 8, and 3 thresholding circuits with the same composition TH1, TH2 and TH3. When an input is equal to multi-value 7, the circuit has a thresholding circuit TH4 whose output is inverted.

The capacity ratio of thresholding circuits TH1 to TH8 is the same as the capacity ratio of a thresholding circuit of a quantizing circuit, and the relationship between the output voltage of capacitive coupling corresponding to input voltage A and output of inverter a is shown in TABLE 9.

The outputs of thresholding circuits TH1 to TH3 are inverted and input to switching means G1, G2 and G3. The output of thresholding circuit TH4 is ordinally input to switching means G1 to G3. Switching means G1 to G3 have the functions of inverting the output of TH1 to TH3 and of cutting the outputs of TH1 to TH3 off when an output of TH4 is inverted by taking the AND of the inverted output and the output of the thresholding circuit TH4.

Adding circuit S2 is composed of 5 capacitances C21, C22, C23, C24, and C25 and source follower SF. Capicitances C21, C22 and C23, the outputs of switching means G1, G2 and G3 are connected, and an output of thresholding circuit TH4 is connected at C24. Reference voltage Vd is connected at C25. The ratio of the capacity of capacitances C21, C22, C23, C24 and C25 is 8:4:2:2:1.

TABLE 9

| Thresholding circuit TH1 | | | | | | | | |
|---|---|---|---|---|---|---|---|---|
| Input Voltage A | 1/16 | 3/16 | 5/16 | 7/16 | 9/16 | 11/16 | 13/16 | 15/16 |
| Output a | 1 | 1 | 1 | 1 | 0 | 0 | 0 | 0 |
| Thresholding Circuit TH2 | | | | | | | | |
| Input Voltage X x 4 | 0.25 | 0.75 | 1.25 | 1.75 | 2.25 | 2.75 | 3.25 | 3.75 |
| Input aX2 | 2 | 2 | 2 | 2 | 2 | 2 | 2 | 2 |
| Vd | 1 | 1 | 1 | 1 | 1 | 1 | 1 | 1 |
| Vout12 | | 3.25/8 | 3.75/8 | 4.25/8 | 4.75/8 | 3.75/8 | 4.25/8 | 4.75/8 |
| Output b | 1 | 1 | 0 | 0 | 1 | 1 | 0 | 0 |
| Thresholding Circuit TH3 | | | | | | | | |
| Input 7.5 | 0.5 | 1.5 | 2.5 | 3.5 | 4.5 | 5.5 | 6.5 | |
| Voltage AX8 | 4 | 4 | 4 | 4 | 4 | 4 | 4 | 4 |
| Input a X 4 | | | | | | | | |
| Input a X 2 | 2 | 2 | 2 | 0 | 0 | 2 | 2 | 0 |
| Vd | 1 | 1 | 1 | 1 | 1 | 1 | 1 | 1 |
| Vout13 | 7.5/16 | 8.5/16 | 7.5/16 | 8.5/16 | 7.5/16 | 8.5/16 | 7/16 | 8.5/16 |
| Output c | 1 | 0 | 1 | 0 | 1 | 0 | 1 | 0 |

Thresholding circuit TH4 is composed of 3 parallelly connected capacitances C14a, C14b and C14c and of inverter INV14 connected in capacitive coupling. Input voltage A is connected to capacitance C14a; reference voltage Vd is connected to C14b; and C14c is grounded. The ratio of the capacity of capacitances of C14a, C14b and C14c is 8:1:7. The thresholding voltage of inverter is Vd/2, and the relationship between voltage value Vout14 when capacitive coupling is performed before the inverter corresponding to the input voltage and output d of inverter INV14 is as shown below in TABLE 10.

A weighted addition results from the adding circuit S2 according to the ratio of capacitances to the input voltage A, the outputs of switching means G1 to G3, and the output voltage B of increment circuit. The sum of them is shown in TABLE 11A.

TABLE 10

| Input Voltage | 1/16 | 3/16 | 5/16 | 7/16 | 9/16 | 11/16 | 13/16 | 15/16 |
|---|---|---|---|---|---|---|---|---|
| Input Voltage A × 8 | 0.5 | 1.5 | 2.5 | 3.5 | 4.5 | 5.5 | 6.5 | 7.5 |
| Vd | 1 | 1 | 1 | 1 | 1 | 1 | 1 | 1 |
| Vout 14 | 1/16 | 2/16 | 3/16 | 4/16 | 5/16 | 6/16 | 7/16 | 8/16 |
| Output d | 1 | 1 | 1 | 1 | 1 | 1 | 1 | 0 |

TABLE 11A

| Input Voltage A | 1/16 | 3/16 | 5/16 | 7/16 | 9/16 | 11/16 | 13/16 | 15/16 |
|---|---|---|---|---|---|---|---|---|
| <Multi-Value | 0 | 1 | 2 | 3 | 4 | 5 | 6 | 7 |

TABLE 11A-continued

| | | | | | | | | |
|---|---|---|---|---|---|---|---|---|
| Output of Switching Means G1 × 8 | 0 | 0 | 0 | 0 | 8 | 8 | 8 | 0 |
| Output of Switching Means G2 × 4 | 0 | 0 | 4 | 4 | 0 | 0 | 4 | 0 |
| Output of Switching Means G3 × 2 | 0 | 2 | 0 | 2 | 0 | 2 | 0 | 0 |
| Output of thresholding Circuit TH4 × 2 | | | | | | | | |
| Voltage Vd | 2 | 2 | 2 | 2 | 2 | 2 | 2 | 0 |
| Reference Voltage Vd | 1 | 1 | 1 | 1 | 1 | 1 | 1 | 1 |
| Output B of Addition Circuit S2 | 3/17 | 5/17 | 7/17 | 9/17 | 11/17 | 13/17 | 15/17 | 1/17 |
| <Multi-Value | 1 | 2 | 3 | 4 | 5 | 6 | 7 | 0> |

As TABLE 11A shows, a function for converting full count value 7 into zero count value 0 is realized and is similar to the conventional digital counter. In a where case a count value is smaller than 7, a counter value always proceeds one step, then input level is output, and increment function for producing a count "1" is realized.

Figure 13:
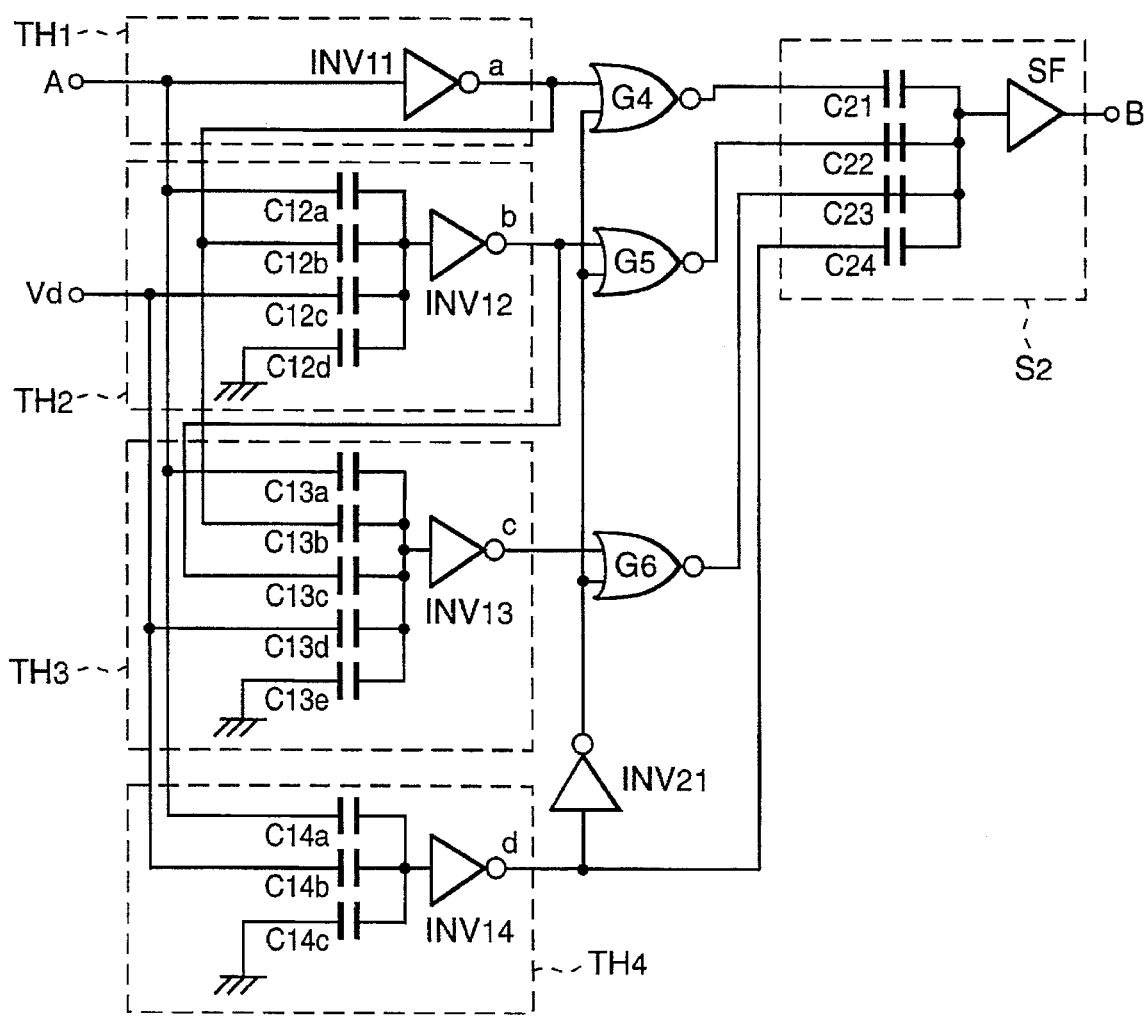
FIG. 13 is a decrement circuit from FIG. 7.

FIG. 13 is a circuit diagram showing another embodiment of an increment circuit. In the embodiment, NOR gates G4, G5 and G6 are used instead of the switching means in FIG. 12. Each thresholding circuit TH1, TH2 and TH3 is connected at their output to one of the input terminals of each of NOR gates. A signal inverted by inverter INV21 from an output of thresholding circuit TH4 are input to the other input terminal.

Addition circuit S2 of the increment circuit in FIG. 13 consists of four parallelly connected capacitances C21, C22 and C23 and C24 and source follower SF. The ratio of the capacitances is 4:2:1:2.

Input voltage A and the outputs from NOR gates G4 to G8 are weighted by the addition circuit S2 according to capacities of capacitances as shown in TABLE 11B. The table shows an addition result of the weighted value, as an output of the increment circuit.

Figure 13A:
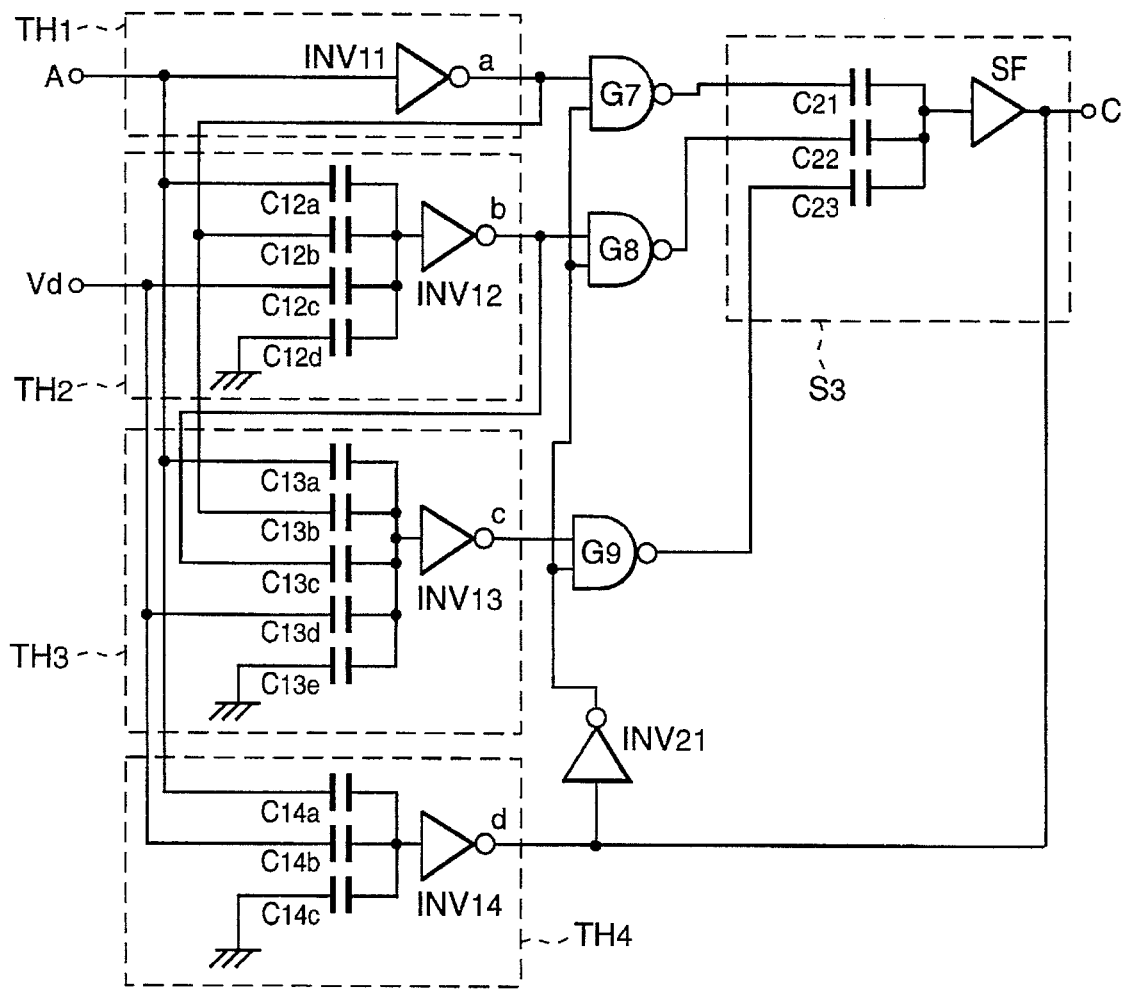
FIG. 13A shows another decrement circuit.

FIG. 13A is a circuit diagram showing an embodiment of a decrement circuit. The decrement circuit has three thresholding circuits TH1, TH2 and TH3 similar to the quantizing circuit in FIG. 8. Additionally, it has thresholding circuit TH4 for inverting an output when an input is greater than or equal to a multi-valued number "1".

Outputs of thresholding circuits TH1 to TH3 are connected to one of the input terminals of NAND gates G7, G8 and G9, and an output of thresholding circuit TH4 is connected to the other input terminal of NAND gates through inverter INV21. An output of each NAND gate is inputted to addition circuit S3, and an output of thresholding circuit TH4 is connected to an output side of addition circuit S3.

Outputs of thresholding circuits TH1 to TH4 corresponding to input voltage A are the same as in TABLE 9 concerning the increment circuit above. On the other hand, thresholding circuit TH4 is composed of 3 parallelly connected capacitances C14a, C14b and C14c and inverter INV15. Input voltage A and reference voltage Vd are connected to capacitances C14a and C14b, respectively. C14c is grounded. The ratio of capacities of these capacitances C14a, C14b and C14c is 8:7:1, and TABLE 12 shows

TABLE 11B

| | | | | | | | | |
|---|---|---|---|---|---|---|---|---|
| Input Voltage A | 1/16 | 3/16 | 5/16 | 7/16 | 9/16 | 11/16 | 13/16 | 15/16 |
| <Multi-Value | 0 | 1 | 2 | 3 | 4 | 5 | 6 | 7> |
| An output of NOR gate G4 × 4 | 0 | 0 | 0 | 0 | 4 | 4 | 4 | 0 |
| An output of NOR gate G5 × 4 | 0 | 0 | 2 | 2 | 0 | 0 | 2 | 0 |
| An output of NOR gate G6 × 4 | 0 | 1 | 0 | 1 | 0 | 1 | 0 | 0 |
| An output of Thresholding Circuit TH4 × 2 | 2 | 2 | 2 | 2 | 2 | 2 | 2 | 0 |
| Output B of Addition Circuit S2 | 2/9 | 3/9 | 4/9 | 5/9 | 6/9 | 7/9 | 8/9 | 0 |
| <Multi-Value | 1 | 2 | 3 | 4 | 5 | 6 | 7 | 0> |

The circuit in FIG. 13 has a function of converting full "7" count to "0" and is similar to the circuit in FIG. 12. The function is realized by stepwisely increasing by "1" with an exception at the full count.

a relationship between resultant voltage Vout 14 by input voltage A and capacitive coupling and outputs of inverter INV14.

TABLE 12

| Input Voltage A | 1/16 | 3/16 | 5/16 | 7/16 | 9/16 | 11/16 | 13/16 | 15/16 |
|---|---|---|---|---|---|---|---|---|
| A × 8 | 0.5 | 1.5 | 2.5 | 3.5 | 4.5 | 5.5 | 6.5 | 7.5 |

TABLE 12-continued

| Vd × 7 | 7 | 7 | 7 | 7 | 7 | 7 | 7 | 7 |
|---|---|---|---|---|---|---|---|---|
| Vout14 | 7.5/16 | 8/5/16 | 10.5/16 | 11.5/16 | 12.5/16 | 13.5/16 | 13.5/16 | 14.5/16 |
| Output d | 1 | 0 | 0 | 0 | 0 | 0 | 0 | 0 |

Adding circuit S2 is composed of 4 parallelly connected capacitances C21, C22, C23 and C24 and a source follower SF. Capacitances C21, C22 and C23 are connected to the outputs of inverters INV21, INV22 and INV23 while C24 is grounded. The ratio of capacitances C21, C22, C23 and C24 is 4:2:1:2.

The weighted ratio of capacitances of adding circuit S2 to input voltage A and each gate G1 to G3 and output voltage C of the decrement circuit, a sum of which is shown in TABLE 13.

TABLE 13

| Input Voltage A | 1/18 | 3/16 | 5/18 | 7/16 | 9/16 | 11/16 | 13/16 | 15/16 |
|---|---|---|---|---|---|---|---|---|
| <Multi-Value | 0 | 1 | 2 | 3 | 4 | 5 | 6 | 7> |
| Output of INV21 × 4 | 1 | 0 | 0 | 0 | 4 | 4 | 4 | 4 |
| Output of INV22 × 2 | 1 | 0 | 2 | 2 | 0 | 0 | 2 | 2 |
| Output of INV23 × 1 | 1 | 1 | 0 | 1 | 0 | 1 | 0 | 1 |
| Output d of Thresholding Circuit | 1 | 0 | 0 | 0 | 0 | 0 | 0 | 0 |
| Output C of Adding Circuit S3 | 1 | 1/9 | 2/9 | 3/9 | 4/9 | 5/9 | 6/9 | 7/9 |
| <Multi-Value | 7 | 0 | 1 | 2 | 3 | 4 | 5 | 6> |

As shown in TABLE 13, a function converting zero count value 0 into full count value 7 is realized similarly to the conventional digital counter. A counter value increases the input level by 1 to get the output in the case where the count value is more than "1". A decrement function is realized by decreasing a count by "1".

As mentioned above, according to the third embodiment, a counter type register circuit can be realized.

Next, the fourth and fifth embodiment of the present invention is described.

Figure 14:
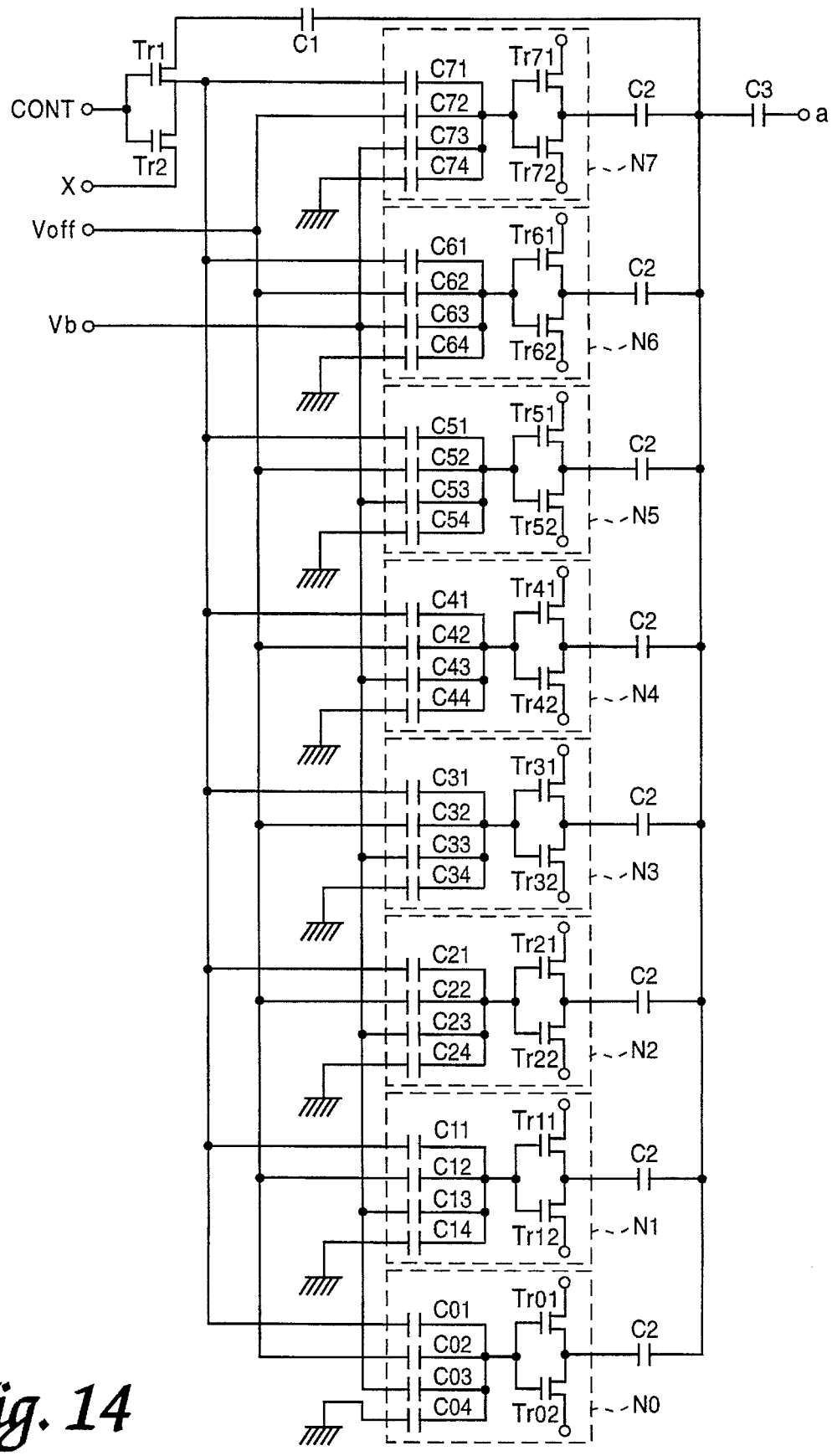
FIG. 14 is the fourth embodiment of the present invention.

As FIG. 14 shows, a register circuit of the fourth embodiment consists of a quantizing circuit mainly composed by parallelly connected 8 thresholding circuits N0 to N7, and capacitor C1 as a hold circuit for holding output voltage "a" of a quantizing circuit and switching circuit SC for switching alternatively an input voltage X or a feedback from the capacitor C1 to an input of the quantizing circuit. Switching circuit SC impresses voltages from each capacitor C1 and input voltage X to a drain of nMOS type transistor Tr1 and pMOS type transistor Tr2 and has an input to a quantizing circuit after connecting each source. The gates of both transistors are connected together, and control signal CONT is input as shown. Input voltage X and a voltage from capacitor C1 are input to the quantizing circuit when control signal CONT is low and it is high, respectively.

Each thresholding circuit N0 to N7 for composing a quantizing circuit is composed of 4 parallelly connected capacitors and an amplifier composed of 2 MOS type transistors.

For example, thresholding circuit N0 is composed of 4 capacitors: capacitor C01 impresses input voltage X or a voltage from capacitor C1, capacitor C02 impresses offset voltage Voff, capacitor C03 impresses reference voltage Vb and capacitor C04 is grounded.

A drain of the type of nMOS transistor comprising the amplifier is impressed by a bias voltage Vdd, and its source is connected to the drain of pMOS type transistor Tr02. The bias voltage Vdd has the same value in all thresholding circuits, and output when each thresholding circuit fires. Gates of both transistors connected to each other are also connected to the juncture of a capacitor, and the source of a pMOS type transistor Tr02 is kept at ground voltage Vss. Other thresholding circuits are also composed of 4 capacitors and 2 transistors. Capacitors, C01, C11, C21, C31, C41, C51, C61 and C71, to which input voltage X of each thresholding circuit is impressed all have the same capacity, and capacitors, C01, C12, C22, C32, C42, C52 and C72, to which an offset voltage is impressed, also all have same capacity. The offset voltage has a peculiar value due to the deviation of production in the LSI manufacturing process. Various values should be applied to cancel this offset.

On the other hand, the capacities of capacitors C03, C13, C23, C33, C43, C53, C63 and C73, to which the reference voltage is impressed, are stepwisely arranged, and the outputs of the thresholding circuits are inverted in response to the rising and falling of input voltage X. The capacities of grounded capacitors C04, C14, C24, C34, C44, C54, C64 and C74 are arranged to offset the change of the capacitor impressing a reference voltage. That is, by showing the capacitor all the thresholding circuits by Ck0, Ck1, Ck2 and Ck3 (k:0 to 7), Formula 3 is established in all thresholding circuits and output voltage Vc of parallelly connected capacitors as shown as Formula 4.

$$Ck0 + C11 + Ck2 + Ck3 = K \quad (K \text{ is a constant number.}) \quad (3)$$

$$Vc = (Ck0X + Ck1Voff + Ck2Vb)/(Ck) + Ck1 + Ck2 + Ck3) \quad (4)$$

In order to change the threshold value of firing of each of the thresholding circuits, the capacity of capacitor Ck2 is changed without changing capacitor Ck3. However, in this case, the design of the register circuit in LSI is complicated because both the numerator and the denominator change in formula 4, so adjustment to the firing threshold is difficult and total capacity of each thresholding circuit is different. In the fourth embodiment, to prevent such an inconvenient condition, the capacity of each capacitance is predetermined in order to satisfy Formula 3.

At the output of each thresholding circuit N1 to N7, the capacitor C2 with the same capacity is connected, and output the of these capacitors are connected to each other. The summation of outputs of each thresholding circuit is outputted as a quantized signal "a" through the capacitor C3 from the juncture.

TABLE 15

| Input Voltage X(V) | | Multi-Assignment | Output | Multi-Assignment |
|---|---|---|---|---|
| X | ≦ 6.0 | 7 | 8Vdd | 7 |
| 6.0 > X | ≦ 5.5 | 6 | 7Vdd | 6 |
| 5.5 > X | ≦ 5.0 | 5 | 6Vdd | 5 |
| 5.0 > X | ≦ 4.5 | 4 | 5Vdd | 4 |
| 4.5 > X | ≦ 4.0 | 3 | 4Vdd | 3 |
| 4.0 > X | ≦ 3.5 | 2 | 3Vdd | 2 |
| 3.5 > X | ≦ 3.0 | 1 | 2Vdd | 1 |
| 3.0 > X | ≦ 2.5 | 0 | Vdd | 0 |
| 2.5 > X | | | | |

Figure 15:
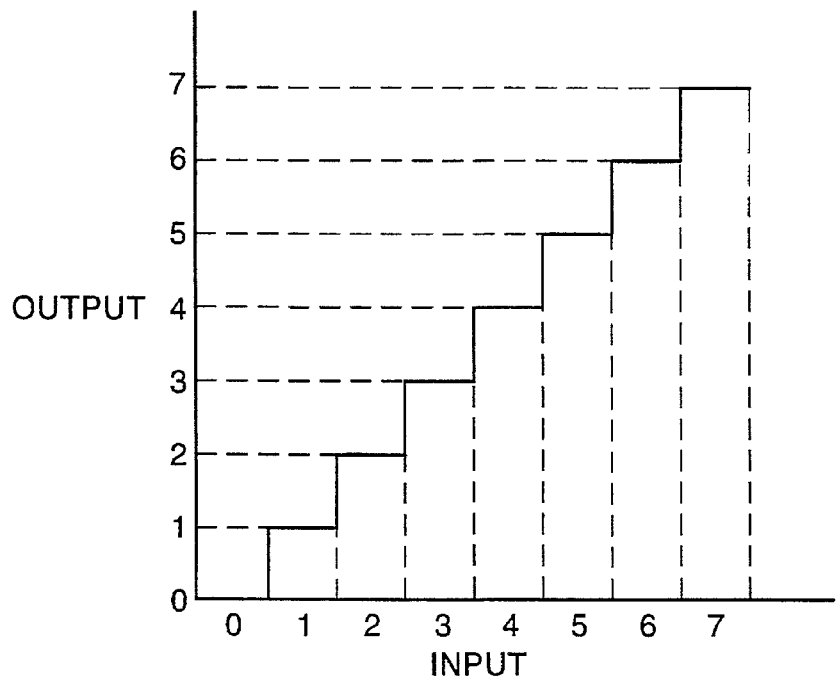
FIG. 15 is a diagram showing the quantizing performance.

Next, the performance of a register circuit of the embodiment according to TABLE 15 and FIG. 15 is explained. Control signal CONT sends to input voltage X as a low level, offset voltage Voff, and reference voltage Vb to each thresholding circuit N0 to N7. When the input voltage exceeds 2.5 V, thresholding circuit N7 fires. Threshold circuits N6 to N0 fire each time input voltage X increases by 0.5 V.

If one thresholding circuit fires, the output becomes Vdd. If the number of the firing thresholding circuit is defined as k, then output voltage becomes k·Vdd.

In this embodiment of the invention, values form 0 to 7 shown in TABLE 15 are assigned to input voltage X, and these values are assigned as stepwise values from Vdd to 8 Vdd corresponding to output voltage "a". As shown in FIG. 15, inputs with a predetermined voltage range are divided into 8 quantized values, and quantization is realized.

Output voltage "a" corresponding to a quantized value is charged at capacitor C1 as a hold circuit after the predetermined charging time, and the voltage is held. The control signal is switched to high level, and an input to a quantizing circuit is switched from input voltage X to output from capacitor C1. The voltage of capacitor C1 is a held voltage of quantized value before switching, so the same value can be obtained even through quantization is repeated. In the case where a small amount of current is lost due to the loss of a circuit, quantized output voltage "a" is not changed, because the voltage is made up to the top level in the process of quantization.

The above circuit functions as a register circuit for holding voltage quantized at the time when a switching circuit is switched to the output of capacitor C1.

By arranging 8 thresholding circuits, only a circuit assigning analog data into 8 was explained. However, by increasing the number of thresholding circuits, it is possible to increase the assigned value, on the other hand, it is possible to decrease the assigned value by decreasing number of thresholding circuits.

A capacitor C2 connected at the output side of each thresholding circuit can be assigned the range of quantized input voltage as the same value in the mentioned embodiment into equal pitch. It is also possible to assign input voltage ranges as different values making up each quantized value.

Figure 16:
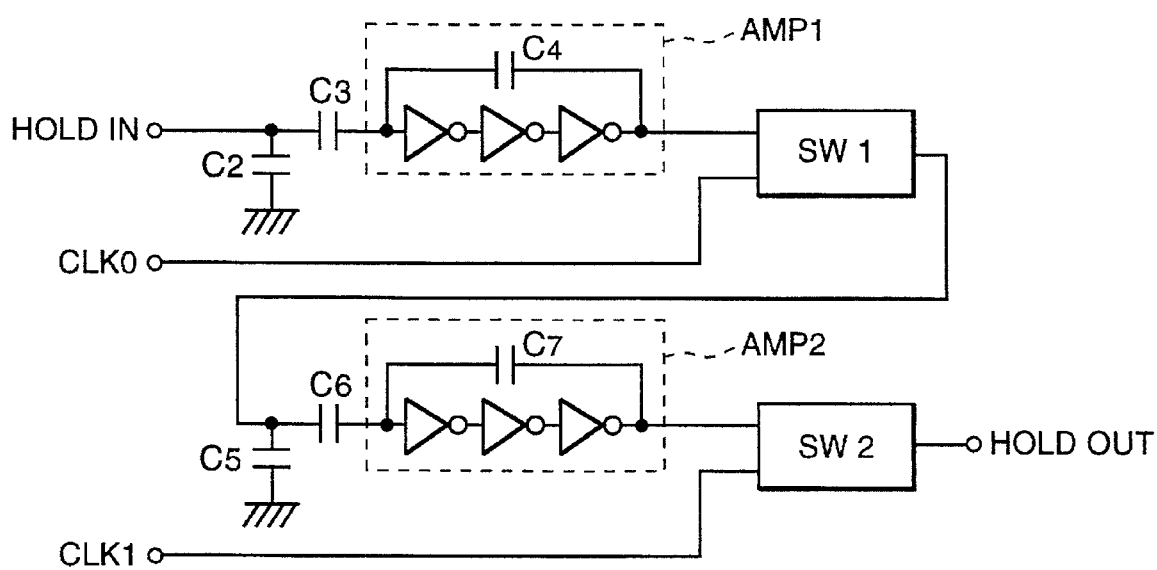
FIG. 16 is another embodiment of the hold circuit in the register circuit of FIG. 14.

FIG. 16 shows a variation of the hold circuit. The circuit is a serially connected circuit comprised of capacitors C2 and C3 and inverse amplifier AMPi connected to a serial circuit comprised of capacitors C5 and C6 and inverse amplifier AMP2 which connects switches SW1 and SW2 to the output of each amplifier.

Each inverse amplifier AMPi and AMP2 has 3 inverters serially connected, and composed of a feedback system for feeding back an output of the third inverter as an input of the first inverter through capacitors C4 and C7. The feedback system is arranged for an additional amplifying-effect.

In the above circuit, voltage "a" input an quantized from input terminal HOLDIN is charged at capacitor C2. When switch SW1 switches ON by clock CLK0, a voltage, inversely amplified by inverse amplifier circuit C2, is charged at capacitor C5. When switch SW2 switches ON by clock CLK2, a voltage, inversely amplified by inverted amplifier circuit AMP2 is output. Clocks CLK1 and CLK2 generate pulses alternatively.

The quantized voltage data is serially outputted by switching these switches SW1 and SW2 ON alternatively.

Figure 17:
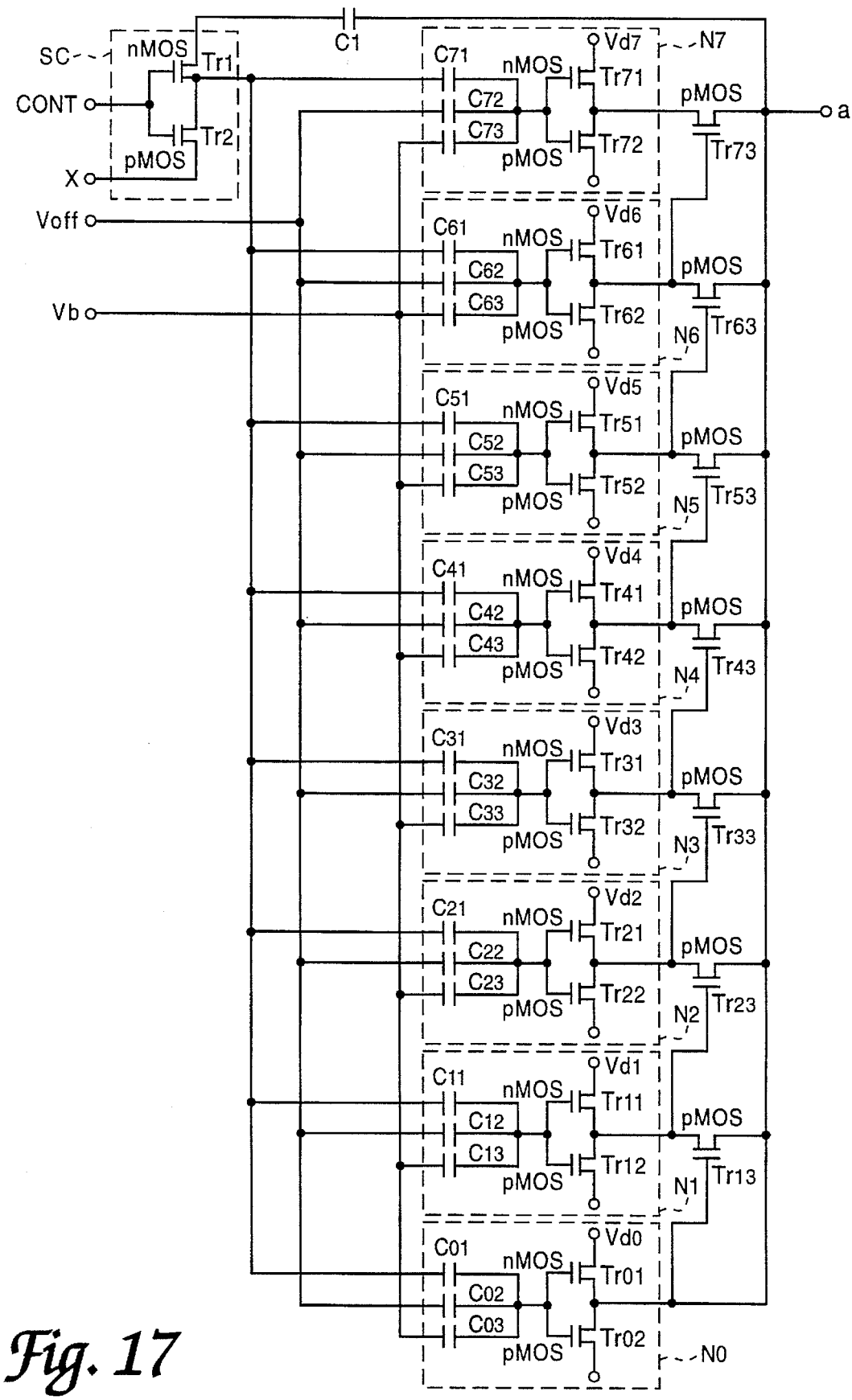
FIG. 17 shows the fifth embodiment of the present invention.

The fifth embodiment of the present invention shows a register circuit described by FIG. 17. A register circuit in the fifth embodiment is comprised of a quantizing circuit composed of 8 thresholding circuits N0 to N7 similar to the fourth embodiment, capacitor C1 as a hold circuit, and a switching circuit SC.

Each thresholding circuit N0 to N7 composing a quantizing circuit is composed of 3 parallelly connected capacitors and an amplifier circuit composed of 2 MOS type transistors. The difference between the fifth embodiment and the fourth embodiment is that of a grounded capacitor.

Capacitors C01, C11, C21, C31, C41, C51, C61 and C71, to which input voltage X of each thresholding circuit is impressed, have the same capacity, and capacitors C02, C12, C22, C32, C42, C52, C62 and C72, to which an offset voltage is impressed, also have equal capacity.

On the other hand, the capacity of capacitors to which a reference voltage is impressed, C03, C13, C23, C33, C43, C53, C63 and C73 are stepwisely arranged, and the output of a thresholding circuit is inverted in response to the change of input voltage X. A bias voltage is supplied to the amplifier circuit, that is, drain voltages Vd0, Vd1, Vd2, Vd3, Vd4, Vd5, Vd6, Vd7 of each nMOS type transistor which are arranged in decreasing order to make an output voltage at which it fires stepwise.

At the output of each thresholding circuit N1 to N7, pMOS typed transistors Tr03, Tr13, Tr23, Tr33, Tr43, Tr53, Tr63 and Tr73 are arranged as a switching elements breaking the lower output threshold of the thresholding circuit, when the thresholding circuit with the higher voltage fires. In the circuit above, a voltage whose output voltage is the highest is obtained as output "a" of a quantizing circuit, among the output of thresholding circuits firing.

TABLE 16

| Input Voltage X(V) | | Multi-Assignment | Output Voltage "A"(V) | Multi-Assignment |
|---|---|---|---|---|
| X | ≦ 6.0 | 7 | Vd0 | 7 |
| 6.0 > X | ≦ 5.5 | 6 | Vd1 | 6 |
| 5.5 > X | ≦ 5.0 | 5 | Vd2 | 5 |
| 5.0 > X | ≦ 4.5 | 4 | Vd3 | 4 |
| 4.5 > X | ≦ 4.0 | 3 | Vd4 | 3 |
| 4.0 > X | ≦ 3.5 | 2 | Vd5 | 2 |
| 3.5 > X | ≦ 3.0 | 1 | Vd6 | 1 |
| 3.0 > X | ≦ 2.5 | 0 | Vd7 | 0 |
| 2.5 > X | | | | |

The performance of a register circuit of the fifth embodiment according to TABLE 16 is described. Each thresholding circuit N0 to N7 is impressed with input voltage X, offset voltage Voff, and a reference voltage Vb, where control signal CONT is at a low level. If input voltage is smaller than 2.5 V, it is indefinite. However, pMOS type transistors Tr03, Tr13, Tr23, Tr33, Tr43, Tr53, Tr63, and Tr73 are switched ON.

Thresholding circuit N7 fires when input voltage X is more than 2.5 V. Each time input voltage X increases by 0.5 V, one of thresholding circuits N6 to N0 fires in order. When input voltage is 3.0>X≦2.5, output voltage "a" is 2.75 V because only thresholding circuit N7 figures. When an input voltage is 3.5>X≦3.0, thresholding circuits N7 and N6 fire. The pMOS type transistor Tr73 as a switching element is switched OFF by firing on N6, and 3.25 V of an output voltage of thresholding circuit becomes output voltage "a". When an input voltage is more than 6.0 V, all thresholding circuits fire. Output voltage 6.25 V of thresholding circuit N0 is obtained as output voltage "a" of quantizing circuit, because pMOS typed transistors as a switching element Tr03, Tr13, Tr23, Tr33, Tr43, Tr53, Tr63, T473 switch OFF.

Values 0 to 7 are assigned to input voltage X in the range shown in TABLE 15, and these values are assigned in steps with the values of 2.75 V to 6.25 V corresponding to output voltage "a". Then, inputs with the predetermined voltage range are divided into eight ranges and quantization is realized.

Output voltage "a" corresponding to quantized values is charges capacitor C1 similar to the fourth embodiment and kept, so that a circuit of the fifth embodiment has a register circuit for holding a voltage quantized from the time a switching circuit is switched to the output of capacitor C1.

The sixth to eighth embodiments are shown in FIG. 18 to 30.

Figure 18:
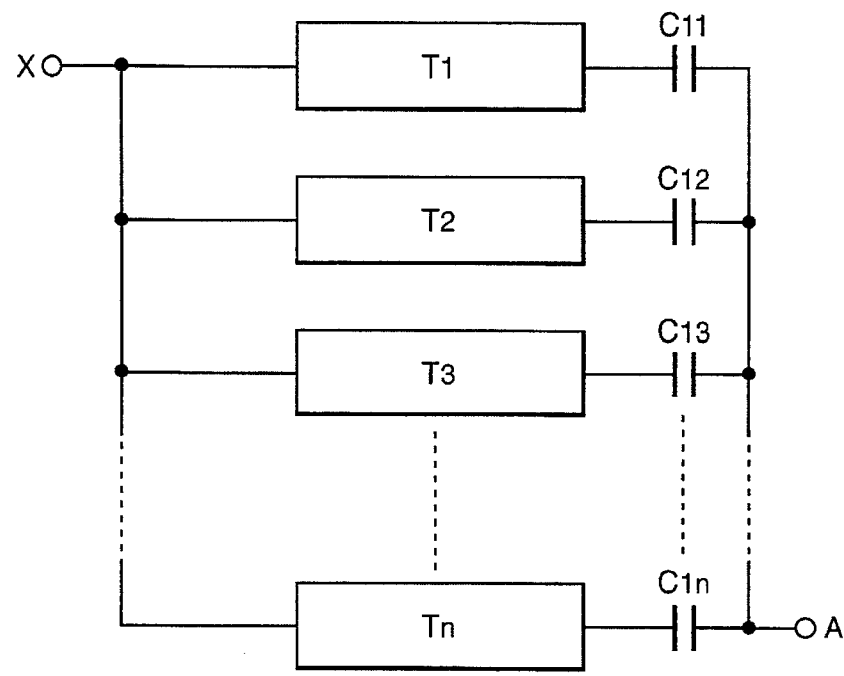
FIG. 18 is the sixth embodiment of the present invention.

FIG. 18 shows a circuit diagram showing the sixth embodiment of a memory circuit of the present invention. A memory circuit in the sixth embodiment comprises an input voltage, several bi-stable circuits connected in parallel T1, T2, T3 . . . and Tn for converting an output voltage after deleting an initial input voltage according to the size ratio between the initial input voltage and a thresholding circuit into low voltage or high voltage and capacitances C11, C12, C13, . . . and Cln are connected to a bi-stable circuit. In each bi-stable circuit, a common analog voltage X is connected to be input as the initial input voltage, and each capacitance is connected with one another and outputted as common output A.

Each bi-stable circuit T1, T2, T3, . . . and Tn is arranged to have a step threshold voltage relatively different from the initial input voltage.

In the sixth embodiment, a thresholding voltage of a bi-stable circuit itself is arranged to have equal step intervals.

In FIG. 18, a bi-stable circuit inverting inputs in its convergence state after the initial voltage is removed is increased stepwise from the initial voltage because the threshold voltages of the bi-stable circuits are successively changed step by step. As a result, adding output voltages of bi-stable circuits through the capacitive coupling, the multi-value data of "n" corresponding to the magnitude of an analog input voltage can be held.

In FIG. 18, the bi-stable circuit inverts the initial voltage at the convergence state when the initial voltage is higher than the threshold value.

When the output of a bi-stable circuit with a higher threshold value is inverted, the multi-valued output obtained can be stepwise settled without weighting the outputs of the bi-stable circuits because the outputs of the bi-stable circuits with lower threshold values are inverted. In the embodiment, convergence voltages of the bi-stable circuits and capacitances C11, C12, C13 . . . and Cn are equal to one another.

Figure 19A:
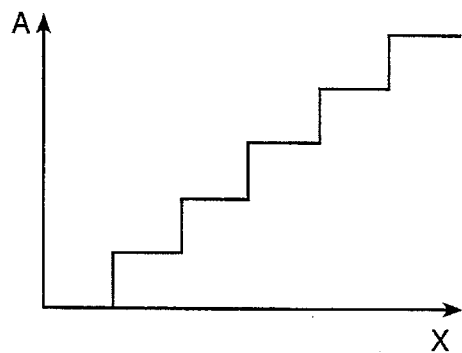
FIGS. 19(a) to 19(c) are diagrams showing the relationship between input and output of the register circuit.

According to the embodiment above, a stepwise output A of constant step size is obtained in response to stepwise input X of constant step size, as shown in FIG. 19(a).

There are two ways to give a weight to the outputs of each bi-stable circuit: one is that outputs of the bi-stable circuits are stepwisely settled and the other is that capacities of capacitances are stepwisely settled, as shown in FIG. (b), by the manners above.

Figure 19B:
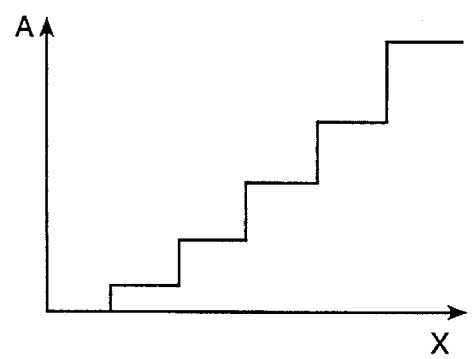
Figure 19C:
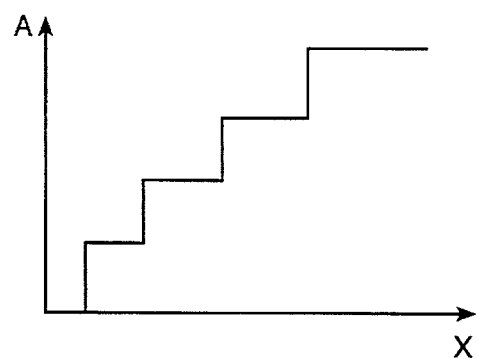

On the other hand, if the difference between the threshold values of the bi-stable circuit are not constant and it has unequal pitches, multi-value of unequal intervals can be obtained in response to input voltage X, as shown in FIG. 19 (c). Furthermore, a relationship between an input and an output of a combination of performances of FIGS. 19 (b) and (c) can be obtained by arranging the weights and threshold value of the output of a bi-stable circuit.

Figure 20:
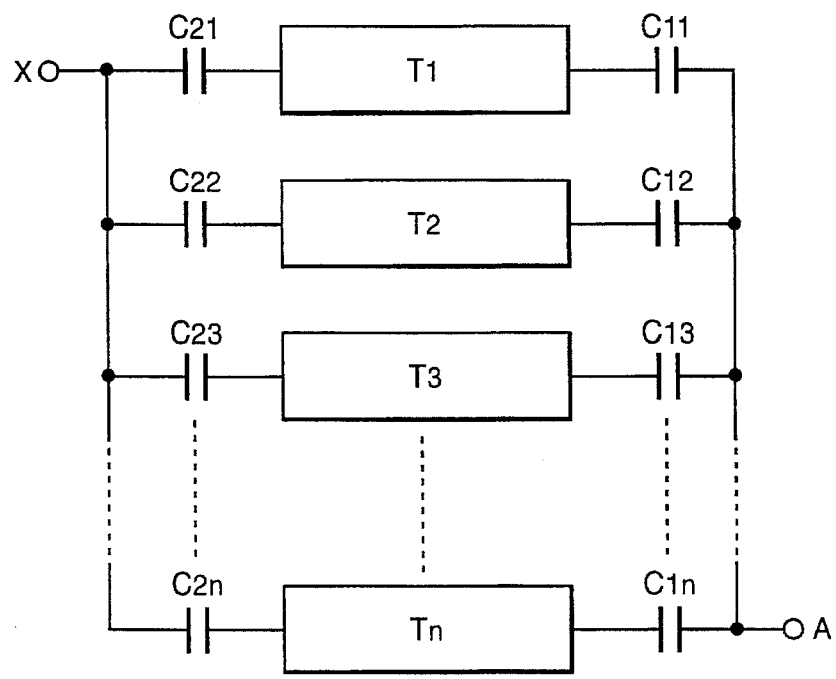
FIG. 20 is a variation of the embodiment in FIG. 18.

FIG. 20 shows a variation of the sixth embodiment. Capacitances C21, C22, C23, . . . and C2n with stepwise increasing capacitances are connected to the inputs of the bi-stable circuits. The threshold values inputted to the bi-stable circuits are equal to one another. An analog input voltage is weighted by capacitances so that the output voltages of the bi-stable circuits are different from one another. Other parts of the circuit are similar to those of FIG. 18, and various relationships between the input and output can be related.

Figure 21:
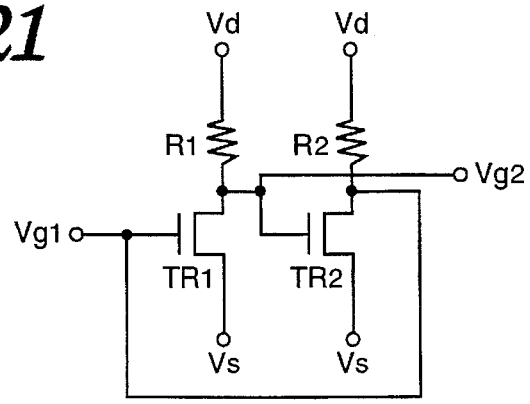
FIG. 21 shows an example of a bi-stable circuit.
Figure 22:
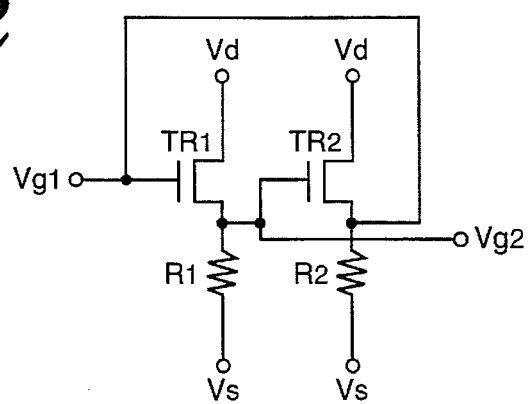
FIG. 22 shows a variation of the bi-stable circuit in FIG. 21.

A bi-stable circuit is composed of a circuit shown in FIG. 21 and FIG. 22. In these circuits, Id-Vg electronics are applied, and a stable output voltage corresponding to the initial voltage is held to be outputted.

A bi-stable circuit shown in FIG. 21 that consists of the first and the second MOS transistors TR1 and TR2, and a drain voltage of one transistor is connected to the gate of the other transistor. Pull-up registers R1 and R2 are connected to the drain of each transistor and voltage Vd is impressed at the other end of the resistances. Voltage V3 is impressed onto the sources of each transistor.

Drain currents Id1 and ID2 of transistors TR1 and TR2 are defined as follows:

$$Id1 = (k1/2)(W/L)(Vg1-VSL1)^2 \{1+\lambda1(Vg2-Vd)\} \quad (5)$$

$$Id1 = (k2/2)(W/L)(Vg2-VSL2)^2 \{1+\lambda2(Vg1-Vd)\} \quad (6)$$

$$Vg2 = Vd - Id1R1 \quad (7)$$

$$Vg1 = Vd - ID2R2 \quad (8)$$

$$k1 = \mu1 Cox1 \quad (9)$$

$$K2 = \mu2 Cox2 \quad (10)$$

W is the width of a channel.
L is the length of a channel.
Vs11 and Vs12 are threshold values of TR1 and TR2.
λ1 and λ2 are indexes representing output resistance of TR1 and TR2.
λ1 and λ2 are the mobility in the channel area of TR1 and TR2.
Cox1 and Cox2 are the capacities of the unit area in the oxide layer of gate.

Here, an input voltage is given to a gate of transistor TR1, and an output is obtained from the drain. By giving the initial value Vin of the input voltage to a gate of transistor TR1 and then removing the input voltage Vin, output voltage Vg2 converges into a high or lower convergent state in response to the initial voltage.

FIG. 22 shows a variation of the bi-stable circuit of FIG. 21. The difference between the circuit of FIG. 22 and that of FIG. 21 is that the pull-down resistances R1 and R2 are connected to the source of transistors TR1 and TR2. Formulas 7 and 8 are changed into Formulas 11 and 12 below.

$$Vg2 = Id1 R1 \quad (11)$$

$$Vg1 = Id2 R2 \quad (12)$$

Figure 23:
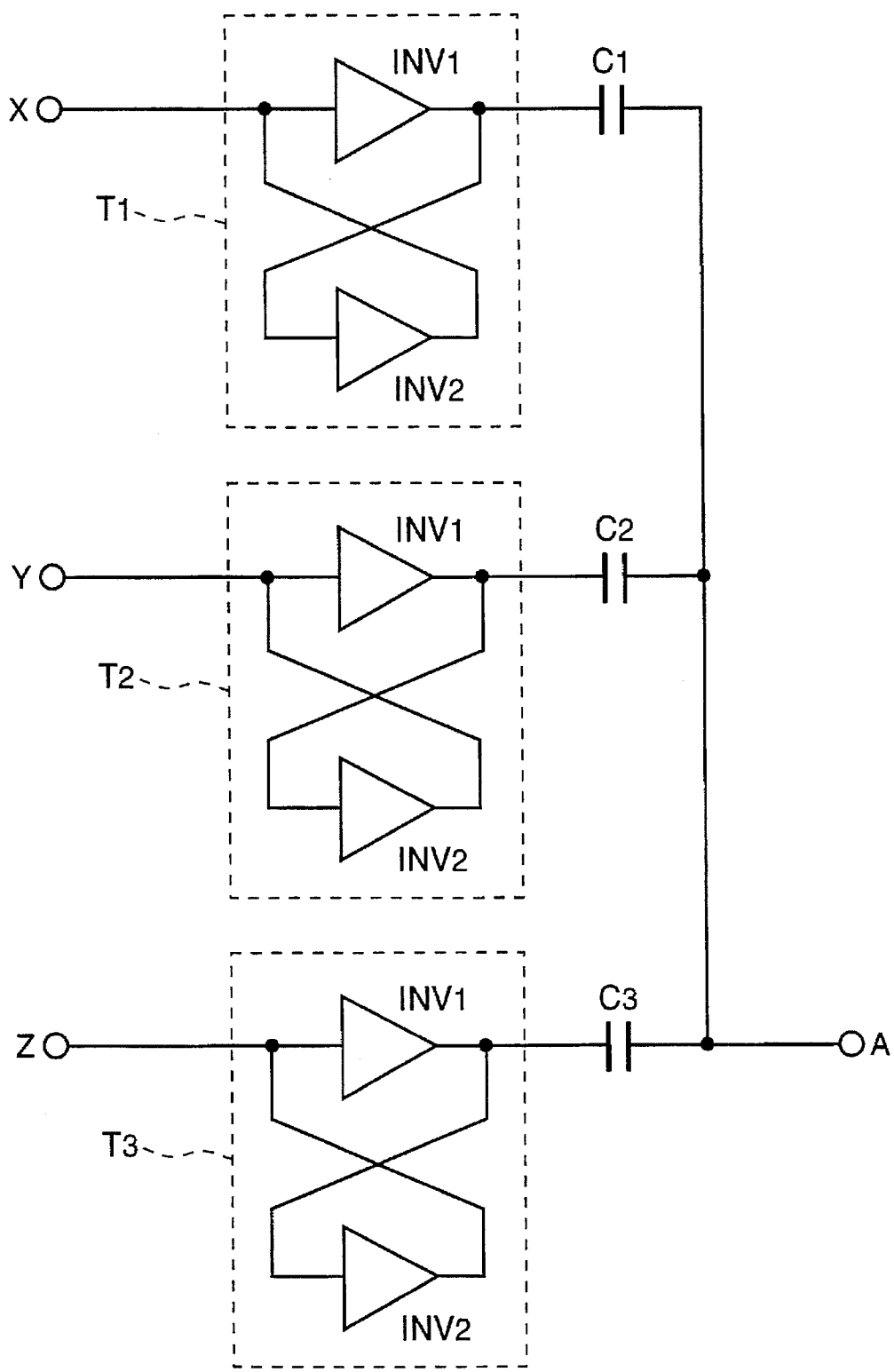
FIG. 23 is the seventh embodiment of the present invention.

FIG. 23 is a circuit diagram showing a memory circuit of the seventh embodiment. In the seventh embodiment, a recurring inverter circuit is used as a bi-stable circuit, which consists of two inverters the output of one inverter being connected to an input of the other inverters.

A memory circuit of the seventh embodiment has 3 recurring inverters (bi-stable circuit) T1, T2 and T3 connected in parallel each of which consists of 2 inverters INV1 and INV2. An input of one inverter INV1 is defined as input terminal X, Y or Z, and an output of the inverter INV1 is connected to a capacitive coupling to be summed as a common output A.

Threshold values of inverter circuits are stepwisely arranged, and capacitances C1, C2 and C3 are equal to one another so as to generate a summation of outputs from T1, T2 and T3 without inverters. In case it is used as a memory circuit, input terminals X, Y and Z are connected to one another to become a common input terminal.

Figure 24:
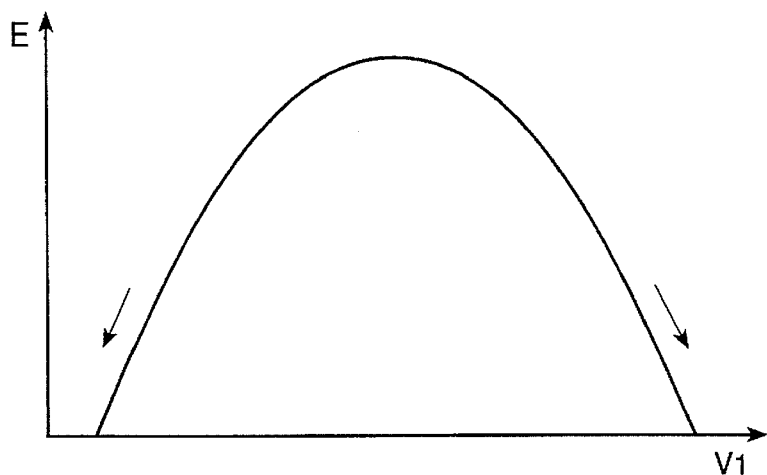
FIG. 24 is a diagram of an inverter circuit with recurring connections.

In one inverter circuit, inverters INV1 and INV2 have two stable points because when one output V1 is H, then the other output V2 is L. FIG. 24 shows an input and output characteristics of each inverter circuit. It shows a relationship between $E(= EO - |V1-V2|$, EO: a reference voltage) and input voltage V1. In the circuit of FIG. 23, an inverted output corresponding to an input becomes an output of the inverter circuit. The characteristics given by a second degree function whose square term is negative.

Each circuit stabilizes by converging in a direction where the potential difference between input voltage V1 and output voltage V2 becomes large. Therefore, each inverter circuit has the function of a binary memory. The stable direction is determined corresponding to an input voltage, whose top characteristic line is a threshold value.

When a plurality of inverter circuits are connected in parallel as shown in FIG. 23 whose threshold voltages are different from one another, a multi-valued memory can be realized.

Figure 25A:
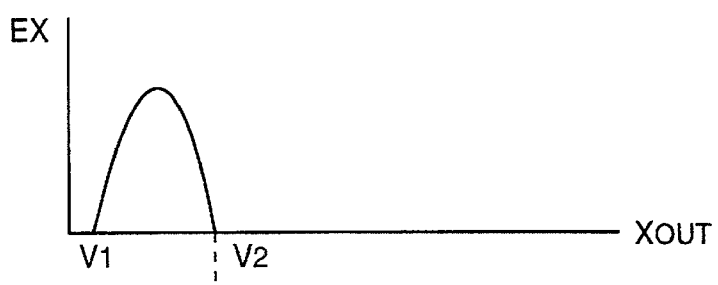
FIG. 25 shows parameter definition of three inverter circuits.
Figure 25B:
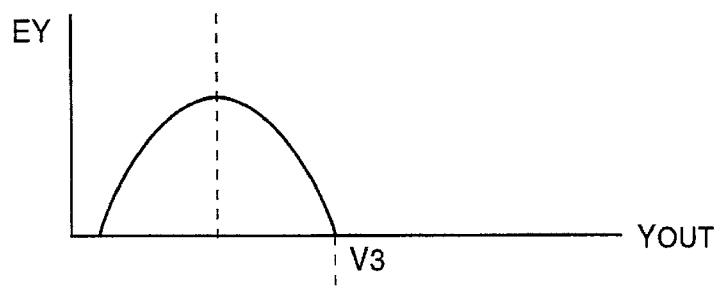
Figure 25C:
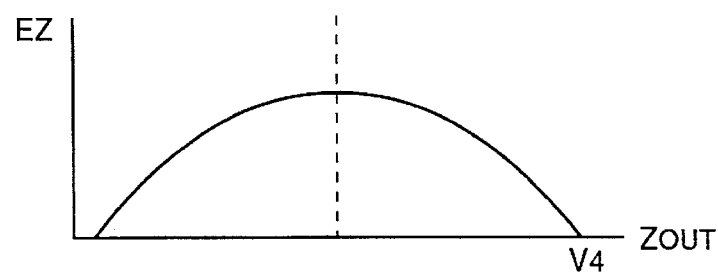

As shown in FIG. 25, when output voltages are XOUT, YOUT and ZOUT of the inverter circuit T1, T2 and T3, and a higher stable voltage of Xout is equal to a half of the higher stable voltage of YOUT and the higher stable voltage of YOUT is equal to a half of that of ZOUT.

A relationship between input voltages VIN and output voltage VOUT is shown in TABLE 16, when the capacitance weighting is equal to 1. A multi-valued memory of 4 levels is thus realized. Characteristics of the output voltage are designed by changing the capacity of the capacitances.

TABLE 16

| INPUT VOLTAGE VIN | OUTPUT VOLTAGE VOUT |
| --- | --- |
| V1–V8 | V1 + V1 + V1 |
| Va–V2 | V2 + V1 + V1 |
| V2–V3 | V2 + V3 + V1 |
| V3–V4 | V2 + V3 + V4 |
| Where, | |
| Va = (V2 − V1)/2 | |

Figure 26:
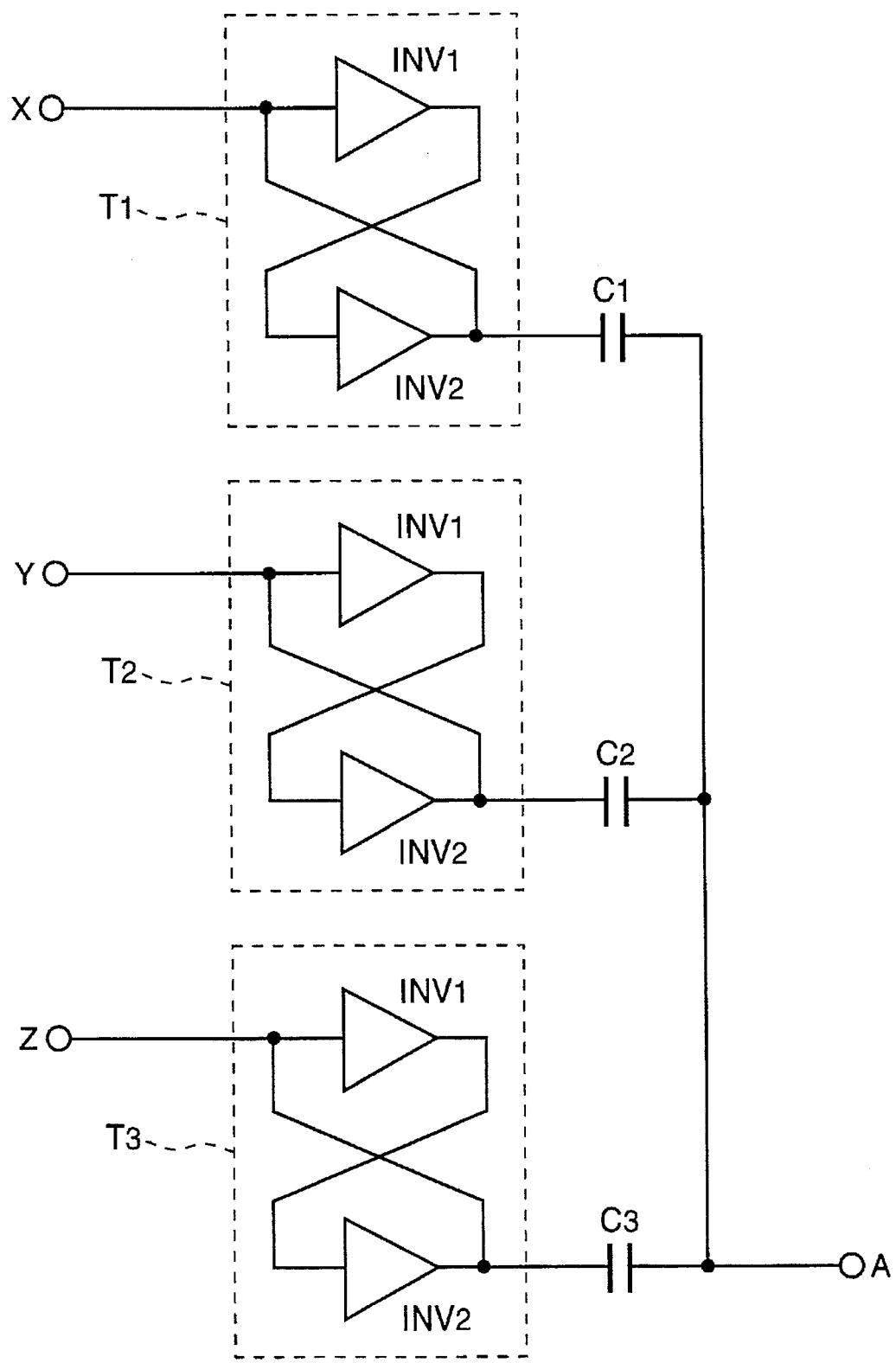
FIG. 26 shows a variation of the seventh embodiment of the present invention.

In FIG. 26, a non-inverted output is connected to the capacitance corresponding to the inputs of each inverter circuit T1, T2 and T3, respectively, as an opposite output embodiment to the circuit of FIG. 23. By such a connection, E-V characteristics of each inverter circuit is inverted in opposite direction of FIG. 7, and it is expressed by a second degree function whose square term is positive.

A circuit in FIG. 23 can be used as a D/A converter of 3 bits with a buffer by defining the characteristics of the inverter circuits to be equal to one another. The ratio of capacitances is defined to be 1:2:4. An analog output shown in TABLE 17 below can be obtained corresponding to a digital input to each terminal. The output is held after the input is removed. In an input signal in the table, 0 is a low level and 1 is a high level. The output signal shows the results of the summation of outputs from the inverter circuits multiplied by the capacity of capacitances "0" when it is at a low level and "1" when it is at a high level.

TABLE 17

| INPUT SIGNAL | | | |
| --- | --- | --- | --- |
| X | Y | Z | OUTPUT SIGNAL |
| 0 | 0 | 0 | 0 + 0 + 0 = 0 |
| 1 | 0 | 0 | 1 + 0 + 0 = 1 |
| 0 | 1 | 0 | 0 + 2 + 0 = 2 |
| 1 | 1 | 0 | 1 + 2 + 0 = 3 |
| 0 | 0 | 1 | 0 + 0 + 4 = 4 |
| 1 | 0 | 1 | 1 + 0 + 4 = 5 |
| 0 | 1 | 1 | 0 + 2 + 4 = 6 |
| 1 | 1 | 0 | 1 + 2 + 4 = 7 |

Figure 27:
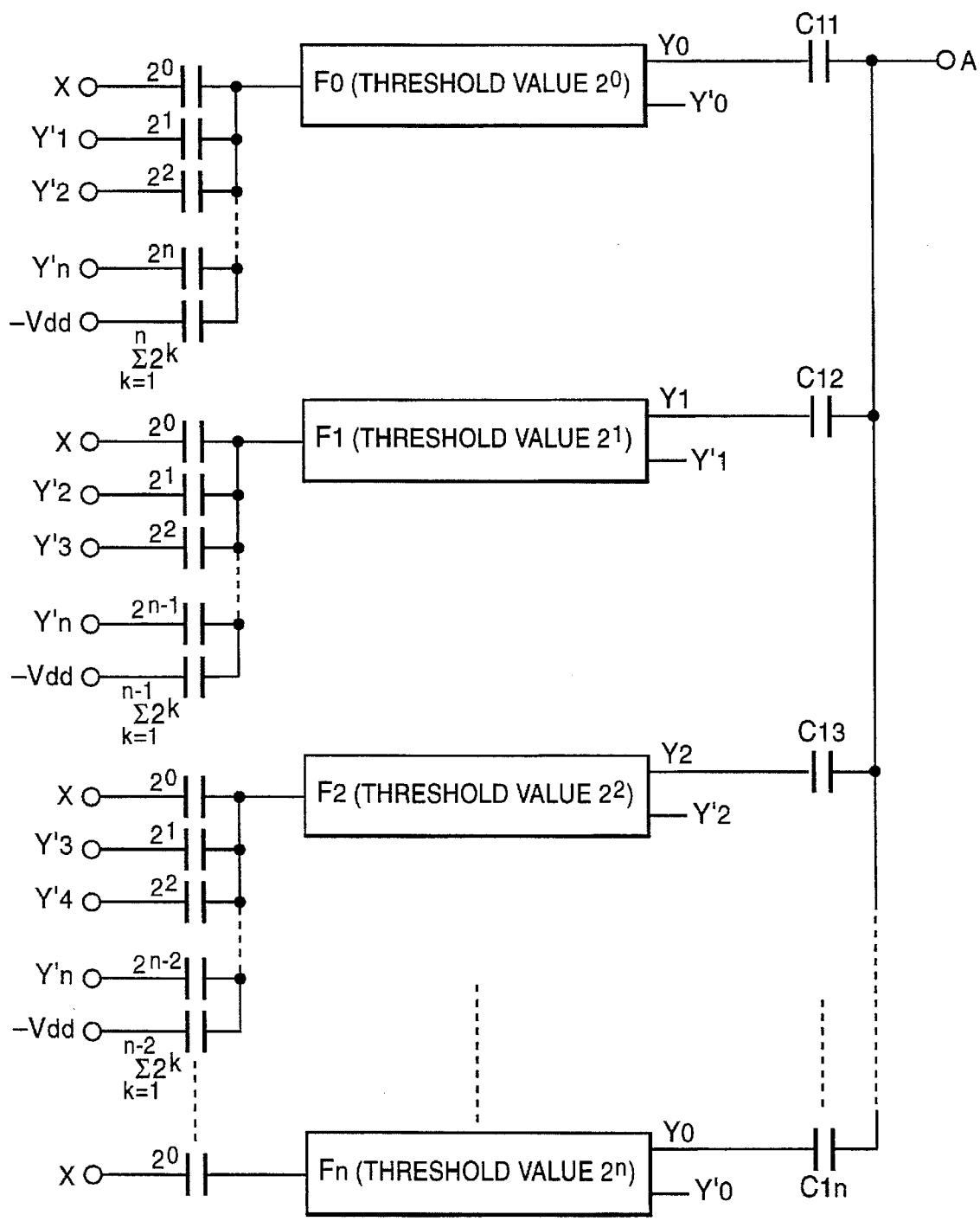
FIG. 27 is the eighth embodiment of the present invention.

FIG. 27 shows an eighth embodiment of a memory circuit according to the present invention. In the eighth embodiment, a flip-flop circuit is used as a bi-stable circuit.

The memory circuit in FIG. 27 includes flip-flop circuits F0, F2, F2 ... and Fn connected in parallel whose threshold values are stepwisely dispersed. Capacitances C10, C11, C212 ... , and C1n are connected to the output of flip-flop to give weights to outputs Y0, Y1, Y2, ... , and Yn of each flip-flop circuit corresponding to the threshold values. These capacitances are connected to one another in a common output terminal.

The threshold values begin at the reference value $2^0$, then $2^1, 2^2, \ldots$ , up to $2^n$, and the capacities of capacitance are C10, C11, ... C1n are $2^0$, , and structured similarly.

A flip-flop circuit receives its input from the common analog input voltage X and inverted output Y'0, Y'1, Y'2, . .. and Y'n of flip-flop circuits weighted through a capacitive coupling having the same weights for the outputs as the threshold value of flip-flop circuits.

As for the flip-flop circuit F0, capacitances at the input side are the reference value 20 for the analog input X, $2^1$ for the inverted output Y'1 of the flip-flop with one level higher threshold. $2^2$ for Y'2 of the two levels higher threshold, ... , $2_n$ for Y'n of the n levels higher threshold.

An inverted output means (Vdd-Vout), when non-inverted output is defined as Vout and a reference voltage is defined as Vdd. In the circuit of FIG. 27, Vdd is input to each input through a capacitance with capacity of Cvdd cancels its influences by offset. The capacitor has a value corresponding to the i-th flip-flop circuit.

$$Cvdd = \sum_{k=1}^{n-i} 2_k$$

According to the threshold and capacity above, each output of the flip-flop circuit corresponds to each bit of nbit binary data where total number of flip-flop circuits is n. An output of each flip-flop circuit corresponding to analog input X is shown in TABLE 18.

TABLE 18

| X  | 0 | 1 | 2 | 3 | 4 | 5 | 6 | 7 | 8 | 9 ... |
|----|---|---|---|---|---|---|---|---|---|-------|
| Y0 | 0 | 1 | 0 | 1 | 0 | 1 | 0 | 1 | 0 | 1 ... |
| Y1 | 0 | 0 | 1 | 1 | 0 | 0 | 1 | 1 | 0 | 0 ... |
| Y2 | 0 | 0 | 0 | 0 | 1 | 1 | 1 | 1 | 0 | 0 ... |
| Y3 | 0 | 0 | 0 | 0 | 0 | 0 | 0 | 0 | 1 | 1 ... |

Figure 28:
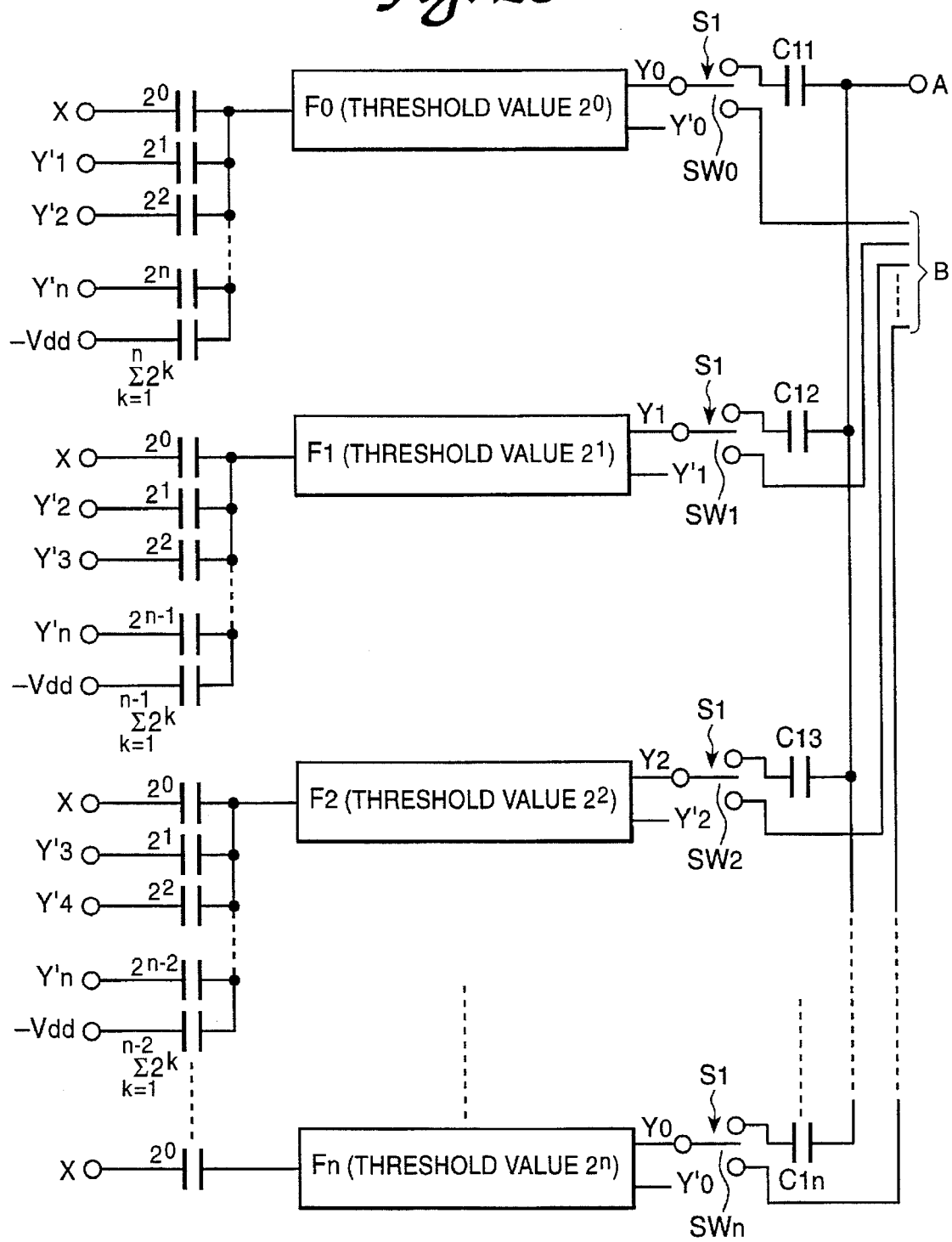
FIG. 28 shows a variation of the eighth embodiment of the present invention.

FIG. 28 is the first variation in changing the shape of the eighth embodiment mentioned above. Switches SW0, SW1, SW2, ... SWn are provided for selectively connecting an output of a flip-flop circuit selectively to capacitances C10, C11, C12, and Cln or a digital output means B.

These switches are analog switches or digital switches selected by analog/digital selecting output signal S1. When they are connected at capacitance side, an analog input is obtained. On the other hand, when they are connected at digital output B side, digital data with nbits are parallelly outputted.

An output of a flip-flop is a digital output of 0 or 1, so that it becomes multi-valued data with $2^n$ levels when added by a capacitive coupling with capacitances of different capacities. When it is branched and parallelly outputted before being inputted to capacitances, it can be used as nbit digital data.

Figure 29:
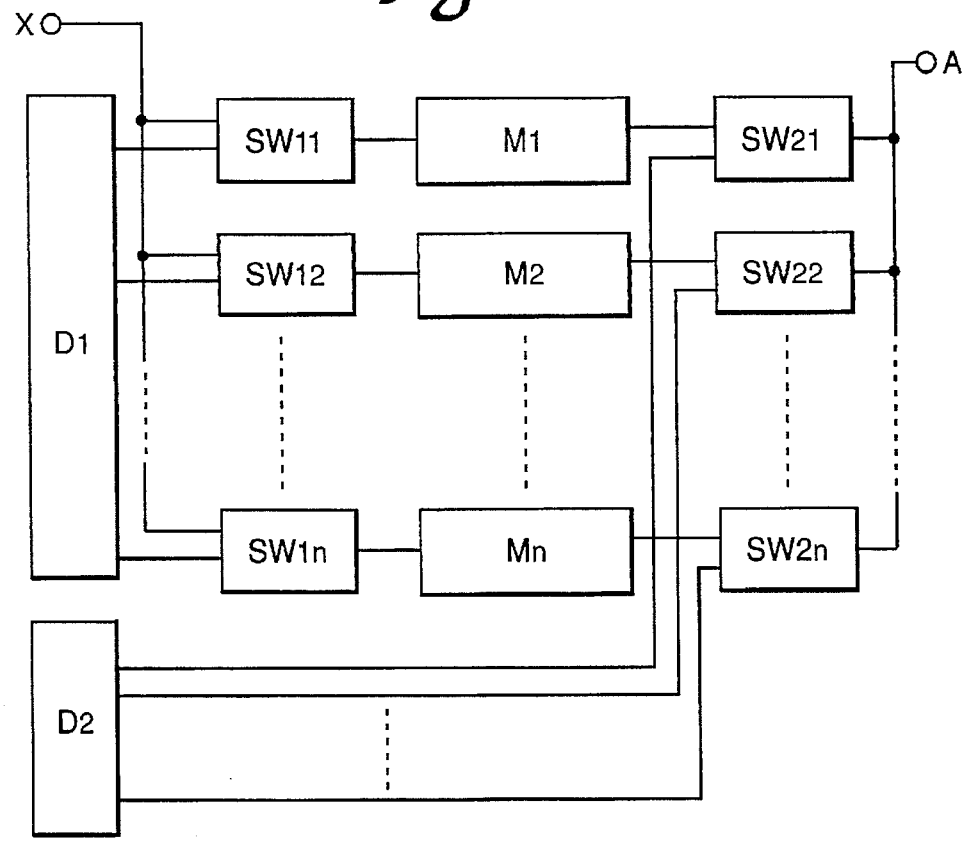
FIG. 29 shows a memory device consisting of the register circuit in FIG. 27.

FIG. 29 is a block diagram showing a composition of a memory ICs using a memory circuit as the basic element of FIG. 28. A plurality of memory circuits M1, M2 and Mn are parallelly arranged, and an analog input voltage X is selectively input to each memory circuit through switches SW11, SW12, ... SW1n for writing the address. The hold signal is selectively outputted through SW21, SW22, ... and SW2n for reading the address.

Address designation is performed by a digital signal, similar to that in a conventional memory circuit. A switch corresponding to the designated address is selected by a decoder D1 or D2 for writing and reading, respectively. A signal written and held is multi-valued information, but the output information can be taken in both digital or multi-valued form corresponding to a selecting signal.

Figure 30:
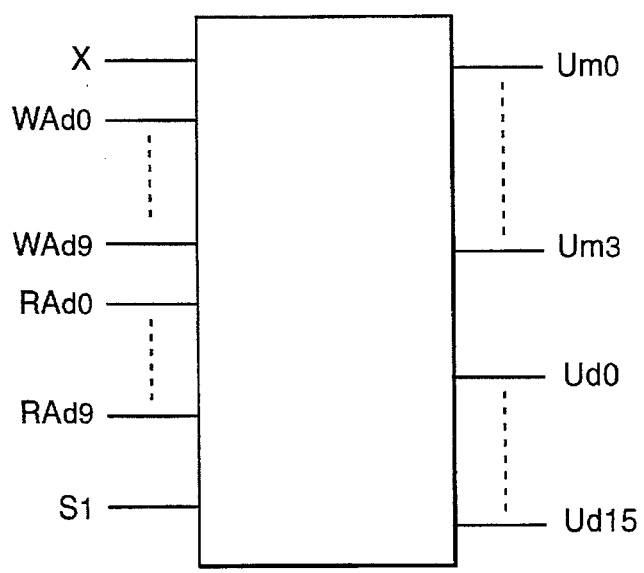
FIG. 30 is a plan view of a package of a memory device in FIG. 29.

FIG. 30 shows pin assignment of an IC in FIG. 29. On the input side, there is an analog input terminal X, writing address designating terminals WAd0 to WAd9, reading address appointing terminals RAd0 to RAd9, and analog digital selecting terminal S. On the output side, there are multi-valued signal output terminals Um0 to Um3 and digital signal output terminals Ud0 to Ud15. Through the 4 sets of multi-valued and digital data output terminals above, the data of 4 successive addresses can be simultaneously outputted, so that the time delay of output is minimized for each side.

According to a composition of the eighth embodiment, it is possible to provide a memory for holding multi-valued data in a circuit of SRAM size. The accuracy of the held data increases in proportion to the size of the memory circuit as a basic circuit. When the accuracy of demanded output data is lower than the specification of circuit, the output time is shortened by neglecting some upper or lower bits. Then reading and writing can be executed at the same time because the data is statistically held.

Figure 31:
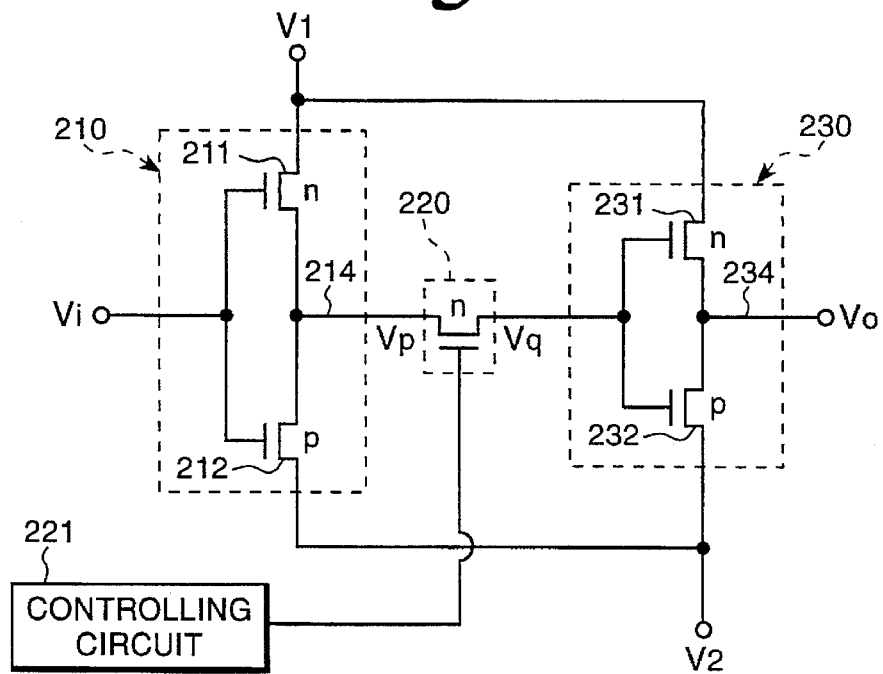
FIG. 31 is the ninth embodiment of the present invention.

FIG. 31 shows the ninth embodiment of the present invention.

A voltage signal converter means 210 has nMOS11 and pMOS12, with a terminal of nMOS11 and a terminal of pMOS12 being connected to each other. Another terminal of nMOS11 is connected to voltage $V_1$ and another terminal of pMOS is impressed with a voltage $V_2$. The input voltage is impressed to gates of nMOS211 and pMOS212. Voltage signal converter means 210 composes a source follower, and it outputs output voltage Vp corresponding to input voltage Vi, from the output terminal 214 arranged between nMOS211 and pMOS212. Output voltage Vp includes an offset determined according to the circuit specification of signal conversing means 210.

The output terminal 214 of voltage signal conversion means 210 is connected with a voltage signal holding means 230 through switching means 220. The voltage signal holding means 230 has nMOS 231 and pMOS 232. A terminal of nMOS231 is connected to the a terminal of PMOS 232. Similarly to the voltage signal converting means 210, the voltage $V_1$ is impressed upon another terminal of nMOS 31, and the voltage $V_2$ is impressed upon another terminal of pMOS232. The output voltage Vp of switch means 220 is impressed by the gate of nMOS 231 and pMOS 232. The output voltage Vq includes a negative offset to be subtracted from Vq as a voltage drop.

Voltage signal holding means 230 is composed of a source follower similar to the voltage signal converting means 210, and it outputs voltage V0 with an offset fixed by the composition of voltage signal holding means 230 to input voltage vq from output terminal 234 between nMOS 231 and pMOS232.

Switching means 220 is composed of an nMOS arranged between the voltage signal converting means 210 and voltage signal holding means 230, and it controls the electrical connections among them. A control voltage is impressed to the gate of the nMOS by a control circuit 221. Switching means 220 keeps the ON state when the control voltage with the predetermined positive value is impressed, otherwise the OFF condition is kept.

When control circuit 221 outputs the control voltage with a predetermined positive value, switching means 220 keeps the ON condition. In this condition, output voltage Vp of voltage signal converting means 10 is changed depending on input voltage Vi. Voltage Vq is then impressed onto gates of MOSs 231 and 232 of voltage signal holding means 230 which is changed depending on input voltage Vi. When input voltage Vi becomes the predetermined value, switch means 220 switches OFF through the performance of control circuit 221. Then, output voltage Vq of switching means 220 is held at a predetermined value corresponding to the capacitance of gates of pMOSs 231 and 232. Therefore, output voltage $V_O$ of voltage signal holding means 30 is held at the fixed voltage value determined by input voltage Vi when switching means 220 is OFF.

As mentioned above, when switching means 220 is OFF, fixed value voltage VO is outputted. That is, the present invention does not need RAMto hold the fixed value and a circuit for D/A conversion of data stored in the RAM. Therefore, the circuit size and the consumed electricity for holding data are both small.

Figure 32:
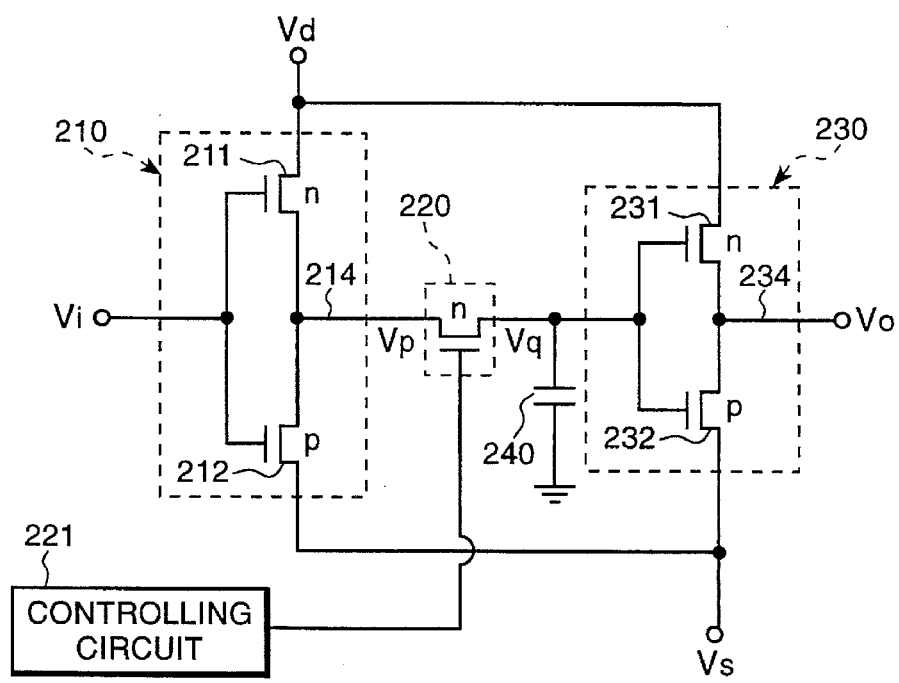
FIG. 32 is the tenth embodiment of the present invention.

FIG. 32 shows a memory circuit of the tenth embodiment of the present invention.

In this embodiment, capacitance 240 is connected between switching means 220 and voltage signal holding means 230. Then a charged holding capacity at the gate of voltage signal holding means 230 becomes large that is and voltage Vq, impressed at the gate in OFF condition of switching means 220 is held at the fixed value for a longer period than that of the ninth embodiment. In addition to advantages of the ninth embodiment, the tenth embodiment a lower holding time of output voltage $V_O$ by voltage signal holding means 230.

In the ninth and tenth embodiments, the nMOS of switching means 220 can be substituted for by pMOS for switching means 210 and 230.

Figure 33:
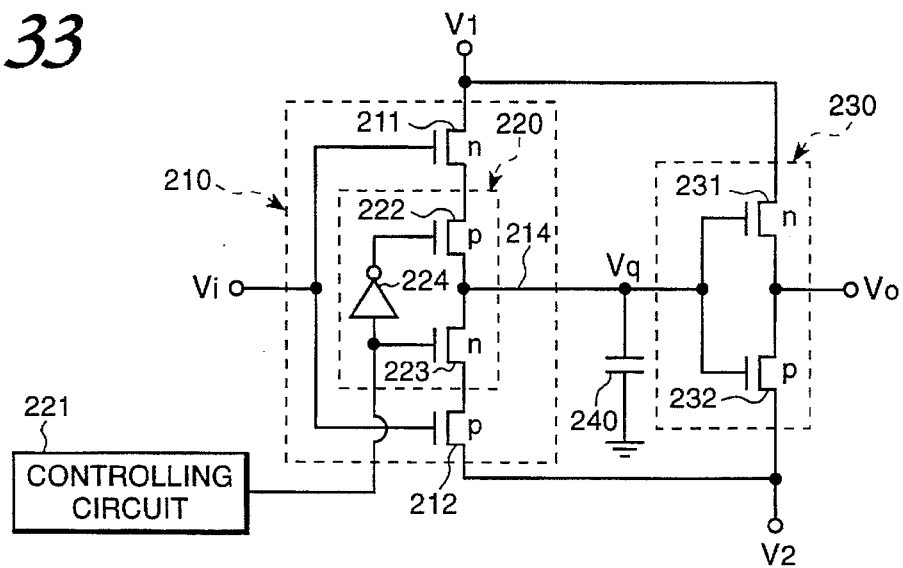
FIG. 33 is the eleventh embodiment of the present invention.

FIG. 33 shows the eleventh embodiment of the present invention.

The embodiment is different from the ninth of the tenth embodiments, in that a switching means 220 is provided in voltage signal converter means 210. Switching means 220 of the eleventh embodiment has pMOS 222 and nMOS 223, with a terminal of pMOS222 connected to a terminal of nMOS223, with another terminal of pMOS 222 connected to with another terminal of nMOS 211, and the source of nMOS 223 is connected to the source of pMOS 212. The gate of pMOS 222 is connected to control circuit 221 through inverter 224, and the gate of nMOS is directly connected to control circuit 221. Output terminal 214 is arranged between pMOS 222 and nMOS 223. Voltage Vq, outputted from the output terminal 214, is impressed to each gate of nMOS 231 and pMOS 232 of the voltage signal holding means 230.

In switching means 220, pMOS222 and nMOS 223 are switched ON and OFF at the same time. By the control circuit 221, the two MOSs 222 and 223 are turned ON and OFF, and voltage Vq of is held in the switch off state. The voltage is impressed upon the gate of MOS231 and 232 of voltage signal holding means.

According to the eleventh embodiment, during the switching off of means 220, the drain current is not generated at the voltage signal converting means 210 so that electricity is not substantially consumed. Therefore, the present embodiment can save electricity in comparison to the ninth and tenth embodiment.

Figure 34:
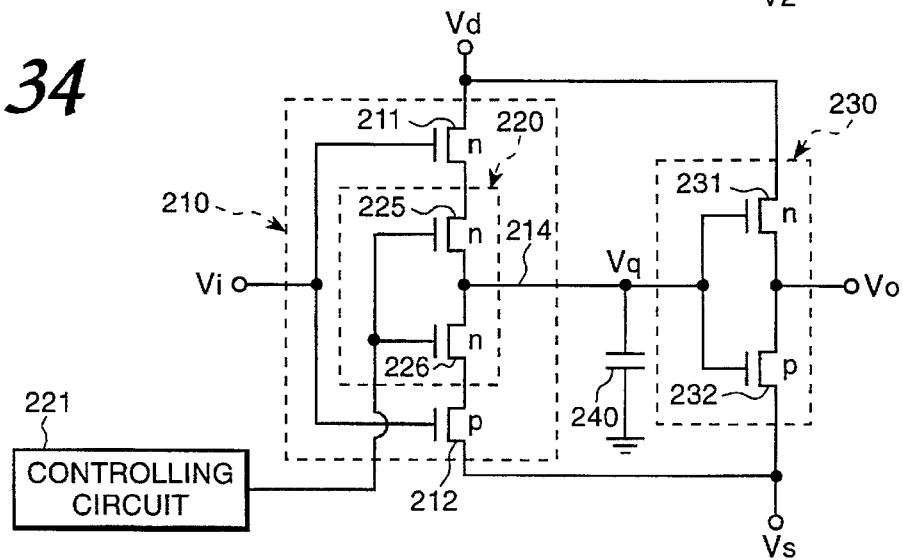
FIG. 34 is the twelfth embodiment of the present invention.

FIG. 34 shows the twelfth embodiment of the present invention.

This embodiment is different from the eleventh embodiment in that the switching means 220 consists of 2 nMOSs 225 and 226. In the eleventh embodiment, output voltage Vq is influenced by not only not only by the offsets of MOSs 211 and 212, but also by the offsets of MOSs 222 and 223 because pMOS 222 and nMOS 223, of switching means 220 is arranged between the 2 MOSs 211 and 212 of the voltage signal converter means 210. However, according to the twelfth embodiment, the offset is not generated because the 2 MOSs 225 and 256 are nMOS. These MOSs 225 and 226 may be a pMOS in order to cancel the offset.

Figure 35:
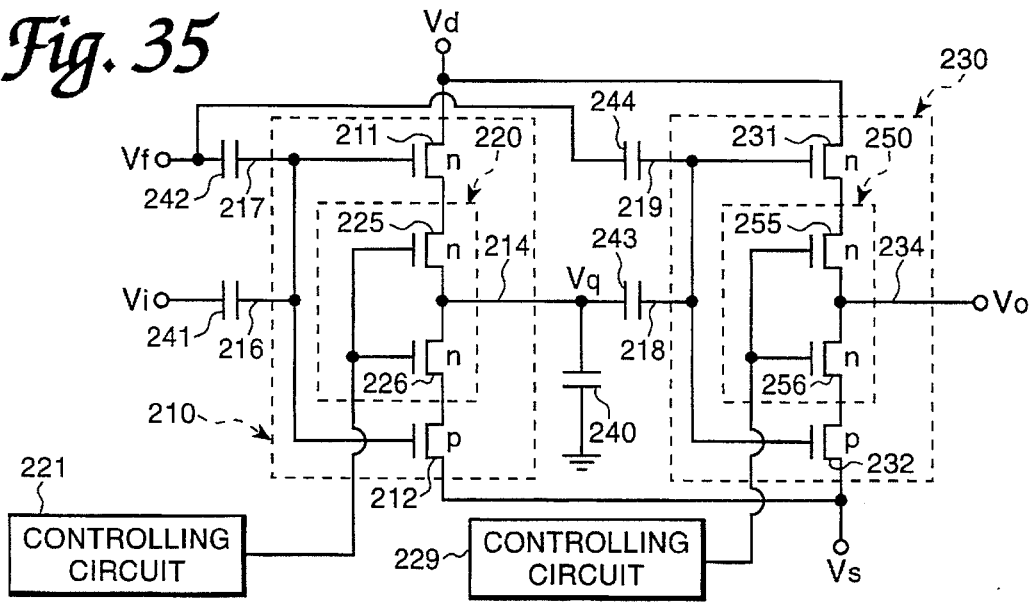
FIG. 35 is the thirteenth embodiment of the present invention.

FIG. 35 shows the thirteenth embodiment of the present invention. In the ninth to the twelfth embodiments mentioned above, an offset corresponding to input voltage is sent to the output voltage of voltage signal converter means 210 and voltage signal holding means 230. In the thirteenth embodiment, a difference from the twelfth embodiment is explained. Offset voltage Vf is impressed, and switch means 250 is arranged in the voltage signal converter means 230.

Switching means 250 is similar to the switching means 220 of the twelfth embodiment and it is composed of 2 nMOSs 255 and 256. The gate of each nMOS 255 and 256 is connected to control circuit 229, and switched ON and OFF by the control circuit 229. The output terminal 234 of voltage signal holding means 230 is arranged between nMOSs 255 and 256.

Input voltage Vi is impressed upon the first input terminal 16 of voltage signal converting means 210 through the capacitor 241, and offset voltage Vf is impressed to the second input terminal 217 of voltage signal converting means 210 through capacitor 242. A voltage increased by Vf over that of the voltage of the twelfth embodiment is sent to the gate of nMOS211 and pMOS212. By controlling offset voltage Vf, it is possible to control the output voltage Vq of voltage signal converter means 210 in ON condition at switching means 220 to be equal to the input voltage Vi.

The first input terminal 218 of voltage signal holding means 230, is connected to the output terminal 214 of voltage signal converter means 230, and offset voltage Vf is impressed through capacitor 244 to the second input 219 of voltage signal converting means 230.

A voltage increased by Vf over that of the voltage of the twelfth embodiment is sent to the gate of pMOS232. The voltage $V_o$ can be controlled to equal Vq during the ON state of means 250 by controlling Vf, similarly in the converting means 210. In the IC, generally, voltage signal conversion means 210 and voltage holding means 230 are formed closely. The product condition is similar and it is also close to the offset voltage value. Therefore, FIG. 35 that shows a common voltage Vf can be used.

According to the present embodiment, by settling the offset voltage Vf adequately, the offset between input and output voltage in voltage signal converting means 210 and voltage signal holding means 230 is deleted. Output voltage $V_o$ is substantially equal to input voltage Vi. Offset voltage Vf can take on both positive and negative values.

On the other hand, switching means 256 is in the OFF condition when the present memory circuit does not output analog data, and it is switched to ON condition before starting to output. By keeping the OFF condition in switching means 250, it is possible to save electricity in the voltage signal holding means 230.

The source voltage Vs is connected to the source of pMOSs in the means 230 and 232, however, Vs can be established by the ground.

What is claimed is:

1. A register circuit comprising:

a quantizing circuit having an input terminal for receiving an analog input voltage and an output terminal for outputting a quantized voltage of said analog input voltage according to predetermined quantizing levels; and a switching circuit for alternatively connecting at least one of said analog input voltage and an output of said quantizing circuit to said input terminal.

2. A register circuit as claimed in claim 1, wherein said quantizing circuit comprises:

a plurality of thresholding circuits with a common threshold voltage, each of said thresholding circuits having an input terminal and an output terminal, wherein each of said thresholding circuits has a different quantizing level; and a plurality of capacitive couplings each of which is provided for one of said thresholding circuits for weighting and adding said analog input voltage to an output at each said output terminal from each of said thresholding circuits having a higher quantizing level.

3. A register circuit as claimed in claim 2, wherein said thresholding circuit inverts an input at said input terminal when said input exceeds said threshold voltage of said thresholding circuit.

4. A register circuit as claimed in claim 3, wherein:

said weights of said capacitive couplings of said thresholding circuits are $2^1, 2^2, \ldots, 2^k$ for outputs from thresholding circuits with higher quantization levels ranging from 1 to k levels, respectively, and a weight of $2^{m+1}$ for said analog input voltage into each said thresholding circuit, where m is the number of said thresholding circuits.

5. A register circuit as claimed in claim 4, further comprising a capacitive coupling for adding said outputs of said thresholding circuits with weights of $2^1, 2^2, \ldots 2^m$ for the lowest threshold, the second threshold, . . . the highest threshold, respectively, whereby a complement of said quantized input voltage is outputted.

6. A register circuit as claimed in claim 4 further comprising a plurality of inverters for inverting a plurality of outputs from said thresholding circuits and a capacitive coupling for adding said outputs of said inverters with weights of $2^1, 2^2, \ldots, 2^m$ for the lowest threshold circuit the second threshold circuit, . . . , the highest threshold circuit, respectively, whereby a quantized voltage is output.

7. A register circuit as claimed in claim 2, wherein a total of outputs from said thresholding circuits are output from said output terminals in parallel as multi-bit data.

8. A register circuit comprising a first flip-flop and a second flip-flop, said first flip-flop including:
a first quantizing circuit having a first input terminal for receiving a first analog input voltage and an output terminal for outputting a first quantization of said first analog input voltage according to first predetermined quantizing levels, and
a switching circuit for alternatively connecting one of said first analog input voltage and an output of said first quantizing circuit to said first input terminal; and said second flip-flop including:
a second quantizing circuit having a second input terminal for receiving a second analog input voltage and an output terminal for outputting a second quantization of said second analog input voltage according to second predetermined quantization levels, and
a switching circuit for alternatively connecting one of an output of said first flip-flop and an output of said second quantizing circuit to said second input terminal; and wherein, said switching circuits of said first and said second flip-flops are controlled by a clock, timings of said clock for said first flip-flop being reversed from timings of said clock for said second flip-flop.

9. A register circuit comprising:

a first flip-flop comprising:
a first quantizing circuit having a first input terminal for receiving a first analog input voltage and an output terminal for outputting a first quantization of said first analog input voltage according to first predetermined quantization levels, and
a first switching circuit for selectively connecting one of said first analog input voltage, said first output of said quantizing circuit, a third input and a fourth input to said first input terminal;

a second flip-flop comprising:
a second quantizing circuit having a second input terminal for receiving an analog input voltage and a second output terminal for outputting a second quantization of said second analog input voltage according to second predetermined quantization levels, and
a second switching circuit for selectively connecting one of an output of said first flip-flop and an output of said second quantizing circuit to said second input terminal;

an increment circuit connected to said output of said second quantizing circuit for outputting a minimum value when said second quantization is a maximum value and otherwise for outputting a value one less than said second quantization as said third input of said first switching circuit; and a decrement circuit connected to said output of said second quantizing circuit for outputting a maximum value when said second quantization is a minimum value and otherwise for outputting a value one more than said second quantization as said fourth input of said first switching circuit.

10. A register circuit as claimed in claim 9, further comprising a circuit for outputting a carry signal when one of said quantizing circuits outputs a minimum value and a different one of said quantizing circuits outputs a maximum value.

11. A register circuit comprising: a quantizing circuit having an input terminal for receiving an analog input voltage and an output terminal for outputting a quantization of said analog input voltage according to predetermined quantizing levels, wherein said quantizing circuit comprises:
a plurality of thresholding circuits, each thresholding circuit having a common threshold voltage and each having an input terminal and an output terminal, and
a plurality of capacitive couplings corresponding to said plurality of thresholding circuits, respectively, at least one of said capacitive couplings weighing and adding said analog input voltage to an output of each thresholding circuit having a higher quantizing level;

a holding circuit for holding said quantized voltage; and a switching circuit for alternatively connecting at least one of said analog input voltage and an output of said holding circuit to said input terminal of said quantizing circuit.

12. A register circuit comprising:

a plurality of bi-stable circuits which invert outputs at different stepwise thresholds: and a capacitive coupling for receiving a total of outputs from said bi-stable circuits and for outputting a weighted addition of said outputs.

* * * * *